(12) United States Patent
Kim et al.

(10) Patent No.: US 9,059,296 B2
(45) Date of Patent: Jun. 16, 2015

(54) OXIDE THIN FILM TRANSISTOR AND METHOD OF FABRICATING THE SAME

(75) Inventors: Hwan Kim, Daegu (KR); Heung-Lyul Cho, Gyeonggi-Do (KR); Tae-Young Oh, Gyeonggi-Do (KR); Ji-Eun Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/490,614

(22) Filed: Jun. 7, 2012

(65) Prior Publication Data

US 2012/0313093 A1    Dec. 13, 2012

(30) Foreign Application Priority Data

Jun. 9, 2011    (KR) .................. 10-2011-0055786

(51) Int. Cl.
```
H01L 29/10      (2006.01)
H01L 29/786     (2006.01)
H01L 27/12      (2006.01)
H01L 21/00      (2006.01)
H01L 29/24      (2006.01)
H01L 29/66      (2006.01)
```
(52) U.S. Cl.
CPC ............ *H01L 29/7869* (2013.01); *H01L 21/00* (2013.01); *H01L 29/24* (2013.01); *H01L 29/66765* (2013.01); *H01L 27/1225* (2013.01); *H01L 27/1288* (2013.01)

(58) Field of Classification Search
CPC ............ H01L 27/1225; H01L 27/1288; H01L 29/7869; H01L 29/24; H01L 21/16; H01L 21/00
USPC ............... 257/43, 59, 351; 438/612, 151, 149
See application file for complete search history.

(56) References Cited

U.S. PATENT DOCUMENTS

| | | | |
|---|---|---|---|
| 6,087,678 A * | 7/2000 | Kim ............................ | 257/59 |
| 6,097,678 A | 8/2000 | Yoshida et al. | |
| 7,646,442 B2 * | 1/2010 | Yang et al. ................. | 349/43 |
| 2005/0099551 A1 | 5/2005 | Yang et al. | |

(Continued)

FOREIGN PATENT DOCUMENTS

| CN | 1619392 A | 5/2005 |
|---|---|---|
| CN | 1845341A A | 10/2006 |

(Continued)

OTHER PUBLICATIONS

Search Report issued in corresponding United Kingdom Patent Application No. 1210001.2 dated Nov. 1, 2012.

(Continued)

*Primary Examiner* — Mohammed Shamsuzzaman
(74) *Attorney, Agent, or Firm* — Morgan, Lewis & Bockius LLP

(57) ABSTRACT

An oxide thin film transistor (TFT) and a fabrication method thereof are provided. First and second data wirings are made of different metal materials, and an active layer is formed on the first data wiring to implement a short channel, thus enhancing performance of the TFT. The first data wiring in contact with the active layer is made of a metal material having excellent contact characteristics and the other remaining second data wiring is made of a metal material having excellent conductivity, so as to be utilized to a large-scale oxide TFT process. Also, the first and second data wirings may be formed together by using half-tone exposure, simplifying the process.

6 Claims, 22 Drawing Sheets

(56) References Cited

U.S. PATENT DOCUMENTS

| | | |
|---|---|---|
| 2006/0226424 A1 | 10/2006 | Chae et al. |
| 2007/0148793 A1 | 6/2007 | Yoshida |
| 2008/0293241 A1 | 11/2008 | Hong et al. |
| 2010/0032666 A1 | 2/2010 | Yamazaki et al. |
| 2010/0084649 A1* | 4/2010 | Seo et al. ............ 257/43 |
| 2010/0133531 A1 | 6/2010 | Akimoto et al. |
| 2010/0163850 A1* | 7/2010 | Chae et al. ............ 257/24 |
| 2010/0163986 A1 | 7/2010 | Kim |
| 2010/0207118 A1 | 8/2010 | Sakata et al. |
| 2010/0295051 A1* | 11/2010 | Choi et al. ............ 257/59 |
| 2010/0304528 A1 | 12/2010 | Kim et al. |
| 2010/0308324 A1* | 12/2010 | Kim et al. ............ 257/43 |
| 2011/0080212 A1* | 4/2011 | Yoshida ............ 327/566 |

FOREIGN PATENT DOCUMENTS

| | | |
|---|---|---|
| CN | 101026010 A | 8/2007 |
| EP | 2256814 A1 | 1/2010 |
| JP | 2000-162641 A | 6/2000 |
| JP | 2001-230321 A | 8/2001 |
| JP | 2010-157702 A | 7/2010 |
| JP | 2010-157720 A | 7/2010 |
| JP | 2010-232652 A | 10/2010 |
| JP | 2011-040731 A | 2/2011 |
| KR | 10-2010-0127593 A | 12/2010 |
| KR | 2010-0127593 A | 12/2010 |
| KR | 10-2011-0056962 A | 5/2011 |

OTHER PUBLICATIONS

Notice of Reason for Refusal dated Sep. 26, 2013 from the Japanese Intellectual Property Office in counterpart Japanese application No. 2012-130499.

Office Action dated Jan. 29, 2014 from the Korea Intellectual Property Office in counterpart Korean application No. 10-2011-0055786.

Notice of Allowance dated Jul. 18, 2014 from the Korea Intellectual Property Office in counterpart Korean application No. 10-2011-0055786. Note: KR10-2010-0127593, KR10-2011-0056962, JP2010-232652, and JP 2011-040731 cited therein are already of record.

First Notification of Office Action dated Jul. 22, 2014 from The State Intellectual Property Office of China in counterpart Chinese application No. 2012101866835. Note: US Pub. 2010/0084649 and USPN 6087678 cited therein are already of record.

* cited by examiner

OXIDE THIN FILM TRANSISTOR AND METHOD OF FABRICATING THE SAME

BACKGROUND OF THE INVENTION

1. Field of the Invention

The present invention relates to an oxide thin film transistor (TFT) and a fabrication method thereof, and more particularly, to an oxide TFT using an oxide semiconductor as an active layer, and a fabrication method thereof.

2. Description of the Related Art

As the consumers' interest in information displays is growing and the demand for portable (mobile) information devices is increasing, research and commercialization of light and thin flat panel displays ("FPD"), which substitute cathode ray tubes (CRTs), the conventional display devices, has increased. Among FPDs, the liquid crystal display ("LCD") is a device for displaying images by using optical anisotropy of liquid crystal. LCD devices exhibit excellent resolution, color display and picture quality, so they are commonly used for notebook computers or desktop monitors, and the like.

The LCD includes a color filter substrate, an array substrate and a liquid crystal layer formed between the color filter substrate and the array substrate.

An active matrix (AM) driving method commonly used for the LCD is a method in which liquid crystal molecules in a pixel unit are driven by using amorphous silicon thin film transistors (a-Si TFTs) as switching elements.

The structure of a related art LCD will now be described in detail with reference to FIG. 1.

FIG. 1 is an exploded perspective view showing a related art LCD device.

As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes a plurality of gate lines 16 and a plurality of data lines 17 which are arranged vertically and horizontally to define a plurality of pixel areas (P), TFTs (T), switching elements, formed at respective crossings of the gate lines 16 and the data lines 17, and pixel electrodes 18 formed on the pixel areas (P).

The color filter substrate 5 and the array substrate 10 are attached in a facing manner by a sealant (not shown) formed at an edge of an image display region to form a liquid crystal panel, and the attachment of the color filter substrate 5 and the array substrate 10 is made by an attachment key (not shown) formed on the color filter substrate 5 or the array substrate 10.

The LCD as described above is light and has low power consumption, and as such, the LCD receives much attention, but the LCD is a light receiving device, not a light emission device, having a technical limitation in brightness, a contrast ratio, a viewing angle, and the like. Thus, the development of a new display device that is able to overcome such shortcomings has been actively made.

An organic light emitting diode (OLED), one of new flat panel display devices, is self-emissive, having an excellent viewing angle and contrast ratio compared to the LCD, and because it does not require a backlight, it can be formed to be lighter and thinner and is advantageous in terms of power consumption. Besides, the OLED can be driven with a low DC voltage and has a fast response speed, and in particular, the OLED is advantageous in terms of fabrication costs.

Recently, research for an increase in the size of an OLED display device has been actively ongoing, and in order to achieve such a large-scale OLED display device, the development of a transistor that can secure constant current characteristics as a driving transistor of an OLED to ensure a stable operation and durability is required.

An amorphous silicon thin film transistor (TFT) used in the above-described LCD may be fabricated in a low temperature process, but it has very small mobility and fails to satisfy a constant current bias condition. Meanwhile, a polycrystalline silicon TFT has high mobility and satisfies constant current bias condition but fails to secure uniform characteristics, making it difficult to increase the area and requiring a high temperature process.

Thus, an oxide semiconductor TFT in which an active layer is formed with oxide semiconductor has been developed. The oxide semiconductor form a large spherical s-orbital based on a material having semiconductor characteristics included in the metal oxide formed as metal and oxygen are bonded, so although it is amorphous, electrons can move easily, implementing fast mobility.

Here, when the oxide semiconductor is applied to an existing TFT having a bottom gate structure, the oxide semiconductor is damaged during a process of etching source and drain electrodes, in particular, during dry etching using plasma.

In order to prevent the problem, an etch stopper is selected to be additionally formed on an upper portion of the active layer, but in this case, it is impossible to uniformly pattern the etch stopper with respect to the entire pixel unit due to a process error, so it is difficult to implement a short channel of 10 μm or less, and a photolithography process (referred to as a 'photo process', hereinafter) is disadvantageously added.

FIG. 2 is a sectional view sequentially showing a related art oxide TFT.

As shown in FIG. 2, a related art oxide TFT includes a gate electrode 21 formed on a certain substrate 10, a gate insulating layer 15a formed on the gate electrode 21, an active layer 24 formed of an oxide semiconductor and an etch stopper 25 made of a certain insulating material on the gate insulating layer 15a, source and drain electrodes 22 and 23 electrically connected to certain regions of the active layer 24, a protective film 15b formed on the source and drain electrodes 22 and 23, and a pixel electrode 18 electrically connected to the drain electrode 23.

FIGS. 3A to 3F are sectional views sequentially showing a process of fabricating the related art TFT illustrated in FIG. 2.

As shown in FIG. 3A, a first conductive film is deposited on the entire surface of the certain substrate 10 and then selectively patterned through a photo process to form the gate electrode 21 formed of the first conductive film.

Next, as shown in FIG. 3B, the gate insulating layer 15a and an oxide semiconductor layer made of a certain oxide semiconductor are sequentially deposited on the entire surface of the substrate 10 and selectively patterned by using a photo process to form the active layer 24 made of the oxide semiconductor above the gate electrode 21.

And then, as shown In FIG. 3C, an insulating layer made of a certain insulating material is deposited on the entire surface of the substrate 10, and then, selectively patterned by using a photo process to form the etch stopper 25 made of the insulating material on the active layer 24.

Thereafter, as shown in FIG. 3D, a second conductive film is formed on the entire surface of the substrate 10 with the etch stopper 25 formed thereon, and then, selectively patterned through a photo process to form the source and drain electrodes 22 and 23 formed of the second conductive film and electrically connected to the source and drain regions of the active layer 24 on the active layer 24 and the etch stopper 25.

And then, as shown in FIG. 3E, the protective film 15b is formed on the entire surface of the substrate 10 with the source and drain electrodes 22 and 23 formed thereon, and then, selectively patterned through a photo process to form a contact hole 40 exposing a portion of the drain electrode 23.

And then, as shown in FIG. 3F, a third conductive film is formed on the entire surface of the substrate 10, and then, selectively patterned through a photo process to form the pixel electrode 18 electrically connected to the drain electrode 23 through the contact hole.

In order to fabricate the oxide TFT having the foregoing structure, the additional photo process is required for form the etch stopper, and in addition, it is difficult to implement a short channel of 10 μm or less due to the use of the etch stopper. Namely, implementation of a short channel is required in order to apply the advantage of fast mobility to an organic electro-luminescence device or implement high transmissivity of a high resolution product, but a channel length is determined by a line width of the etch stopper, and since precision is required for a design margin between the gate electrode, the etch stopper, and the source and drain electrodes, it is impossible to uniformly patterning the etch stopper with respect to the entire pixel unit due to a process error, thus making it difficult to implement a short channel of 10 μm or less.

SUMMARY OF THE INVENTION

An object of the present invention is to provide an oxide thin film transistor (TFT) using an oxide semiconductor as an active layer and applied to a large display, and a fabrication method thereof.

Another object of the present invention is to provide an oxide TFT having enhanced performance by implementing a short channel and formed through a simplified process, and a fabrication method thereof.

To achieve these and other advantages and in accordance with the purpose of embodiments of the invention, as embodied and broadly described, there is provided a method for fabricating an oxide thin film transistor (TFT), including: forming a gate electrode and a gate line formed of a first conductive film on a substrate; forming a gate insulating layer on the substrate with the gate electrode and the gate line formed thereon; forming a source electrode, a first drain electrode, and a first data line formed of a second conductive film at an upper portion of the gate electrode with the gate insulating film formed thereon, and forming a second drain electrode and a second data line formed of a third conductive film on an extended portion of the first drain and the first data line, by using half-tone exposure; and forming an active layer made of an oxide semiconductor on the source electrode and the first drain electrode.

The active layer may be made of an amorphous zinc oxide-based semiconductor.

The second conductive film may be made of a metal material selected from a group including molybdenum titanium (MoTi), indium-tin-oxide (ITO), titanium, and molybdenum (Mo).

The third conductive film may be made of a metal material selected from a group including aluminum, copper, silver, or gold, different from that of the second conductive film.

The active layer may be formed in an island form positioned between the second data line and the second drain electrode.

To achieve these and other advantages and in accordance with the purpose of embodiments of the invention, as embodied and broadly described, there is also provided a method for fabricating an oxide thin film transistor (TFT), including: forming a gate electrode and a gate line on a substrate; forming a gate insulating layer on the substrate with the gate electrode and the gate line formed thereon; forming a source electrode, a first drain electrode, and a first data line at an upper portion of the gate electrode with the gate insulating film formed thereon; forming an active layer made of an oxide semiconductor on the source electrode and the first drain electrode; forming an etch stopper on the active layer; and forming a second source electrode and a second drain electrode at an upper portion of the active layer with the etch stopper formed thereon, and forming a second data line on the first data line.

The first drain electrode and the second drain electrode may have an extended portion extending to the pixel region, respectively, and the extended portion of the second drain electrode may be formed on the extended portion of the first drain electrode.

To achieve these and other advantages and in accordance with the purpose of embodiments of the invention, as embodied and broadly described, there is also provided an oxide thin film transistor (TFT) including: a gate electrode and a gate line formed of a first conductive film and formed on a substrate; a gate insulating layer formed on the substrate with the gate electrode and the gate line formed thereon; a source electrode, a first drain electrode, and a first data line formed of a second conductive film and formed at an upper portion of the gate electrode with the gate insulating film formed thereon; a second drain electrode and a second data line formed of a third conductive film and formed on an extended portion of the first drain and the first data line; and an active layer made of an oxide semiconductor and formed on the source electrode and the first drain electrode.

The active layer may be made of an amorphous zinc oxide-based semiconductor.

The second conductive film may be made of a metal material selected from a group including molybdenum titanium (MoTi), indium-tin-oxide (ITO), titanium, and molybdenum (Mo).

The third conductive film may be made of a metal material selected from a group including aluminum, copper, silver, and gold, different from that of the second conductive film.

The active layer may be formed in an island form positioned between the second data line and the second drain electrode.

To achieve these and other advantages and in accordance with the purpose of embodiments of the invention, as embodied and broadly described, there is also provided an oxide thin film transistor (TFT) including: a gate electrode and a gate line formed on a substrate; a gate insulating layer formed on the substrate with the gate electrode and the gate line formed thereon; a source electrode, a first drain electrode, and a first data line formed at an upper portion of the gate electrode with the gate insulating film formed thereon; an active layer made of an oxide semiconductor and formed on the source electrode and the first drain electrode; an etch stopper formed on the active layer; a second source electrode and a second drain electrode formed at an upper portion of the active layer with the etch stopper formed thereon; and a second data line formed on the first data line.

The first drain electrode and the second drain electrode may have an extended portion extending to the pixel region, respectively, and the extended portion of the second drain electrode may be formed on the extended portion of the first drain electrode.

First source and drain regions of the active layer may be electrically connected to the first source and drain electrodes, and second source and drain regions of the active layer may be electrically connected to the second source and drain electrodes.

In the oxide TFT and a fabrication method thereof according to an embodiment of the present invention, an amorphous oxide semiconductor is used as an active layer, obtaining excellent uniformity, so the oxide TFT can be applicable to a large display.

In the oxide TFT and a fabrication method thereof according to an embodiment of the present invention, since a short channel ranging from 4 μm to 10 μm is implemented, on-current is enhanced, parasitic capacitance is reduced, or transmissivitiy is enhanced. Namely, the performance of the large oxide TFT can be enhanced.

In the oxide TFT and a fabrication method thereof according to an embodiment of the present invention, etch stopper can be omitted to save a photo process, so effect of simplifying a process can be obtained.

In the oxide TFT and a fabrication method thereof according to an embodiment of the present invention, since the source and drain electrodes are formed on upper and lower portions of the active layer, the contact area between the active layer and the source and drain electrodes can be increased, and in this case, ohmic-contact can be improved to enhance device characteristics.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

An oxide thin film transistor (TFT) and a fabrication method thereof according to exemplary embodiments of the present invention will be described with reference to the accompanying drawings.

Figure 1:
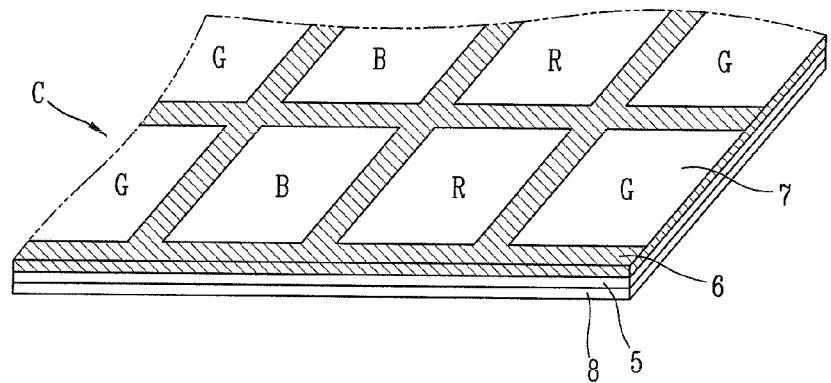
FIG. 1 is an exploded perspective view schematically showing a related art liquid crystal display (LCD) device.
Figure 1:
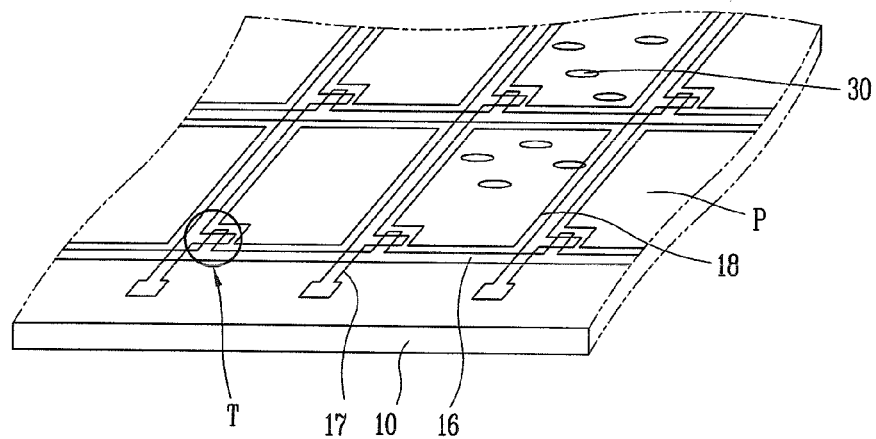
Figure 2:
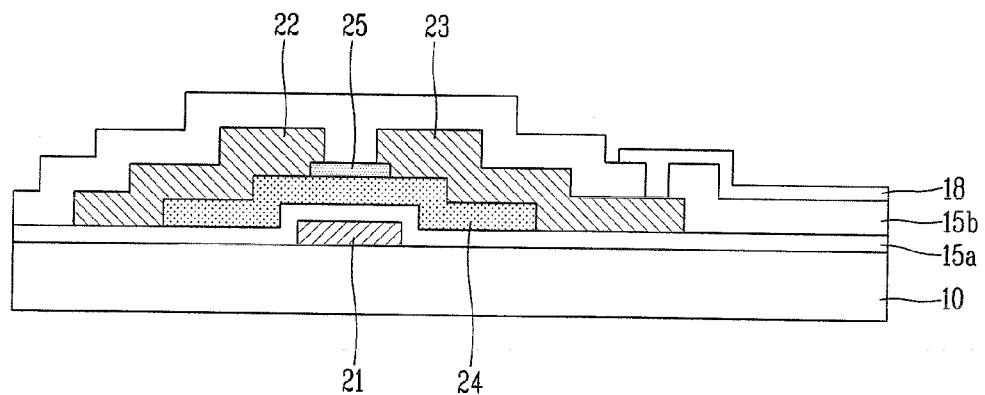
FIG. 2 is a sectional view schematically showing a related art oxide thin film transistor (TFT)
Figure 3A:
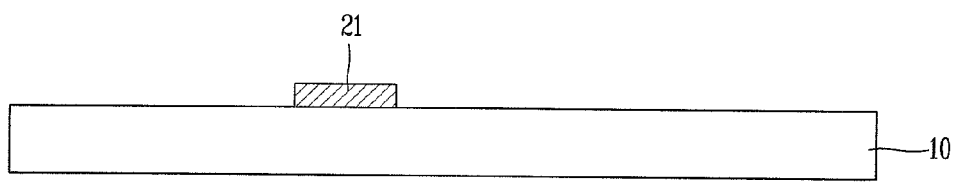
FIGS. 3A to 3F are sectional views sequentially showing the process of fabricating the related art oxide TFT illustrated in FIG. 2.
Figure 3B:
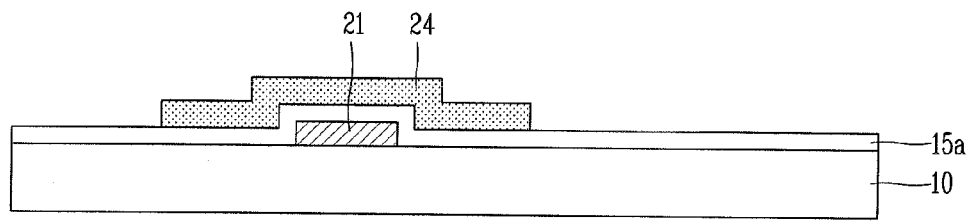
Figure 3C:
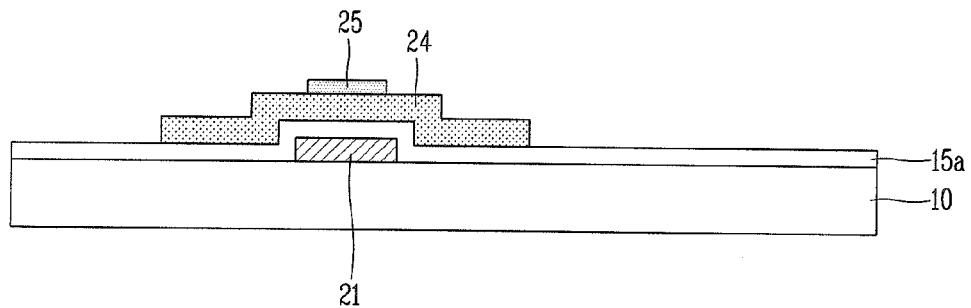
Figure 3D:
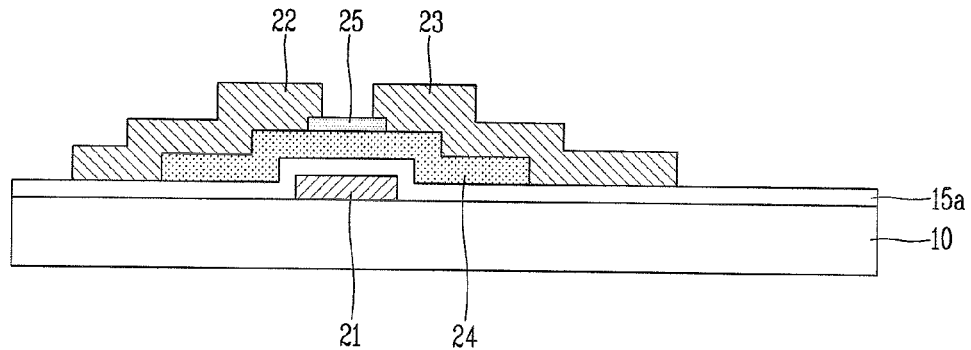
Figure 3E:
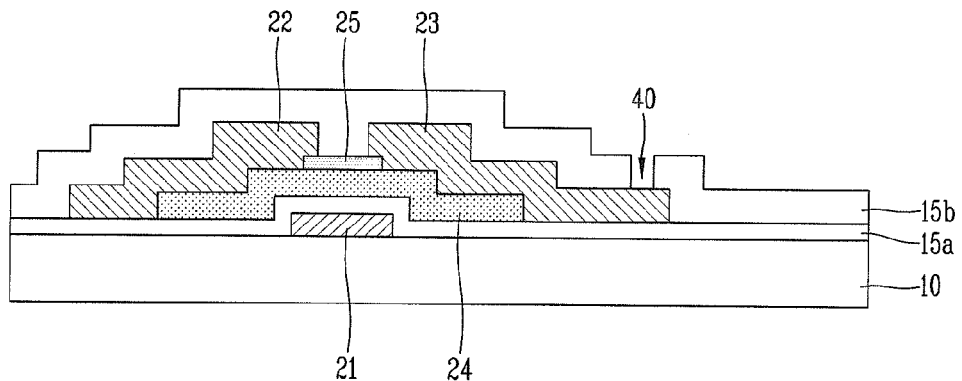
Figure 3F:
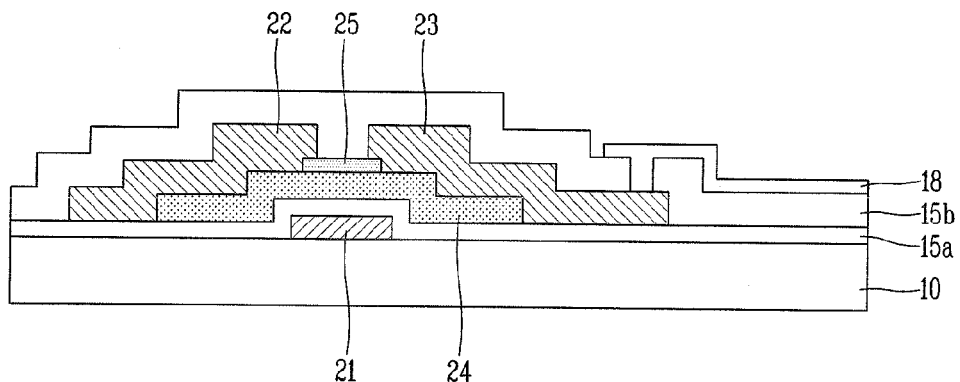
Figure 4:
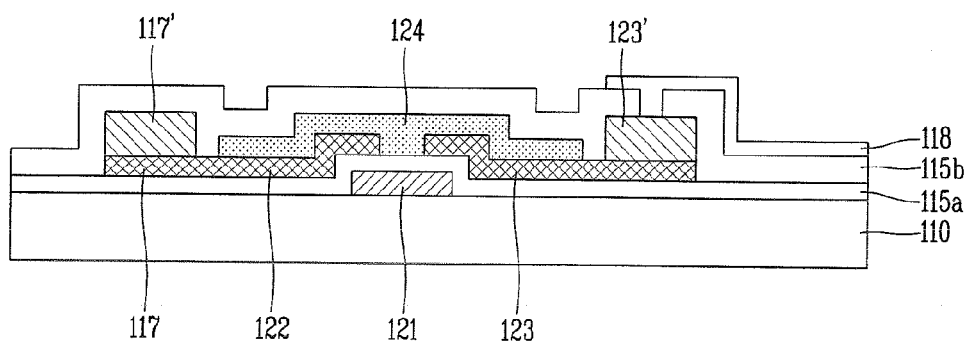
FIG. 4 is a sectional view schematically showing an oxide thin film transistor (TFT) according to a first embodiment of the present invention.

FIG. 4 is a sectional view schematically showing an oxide TFT according to a first exemplary embodiment of the present invention.

Figure 5:
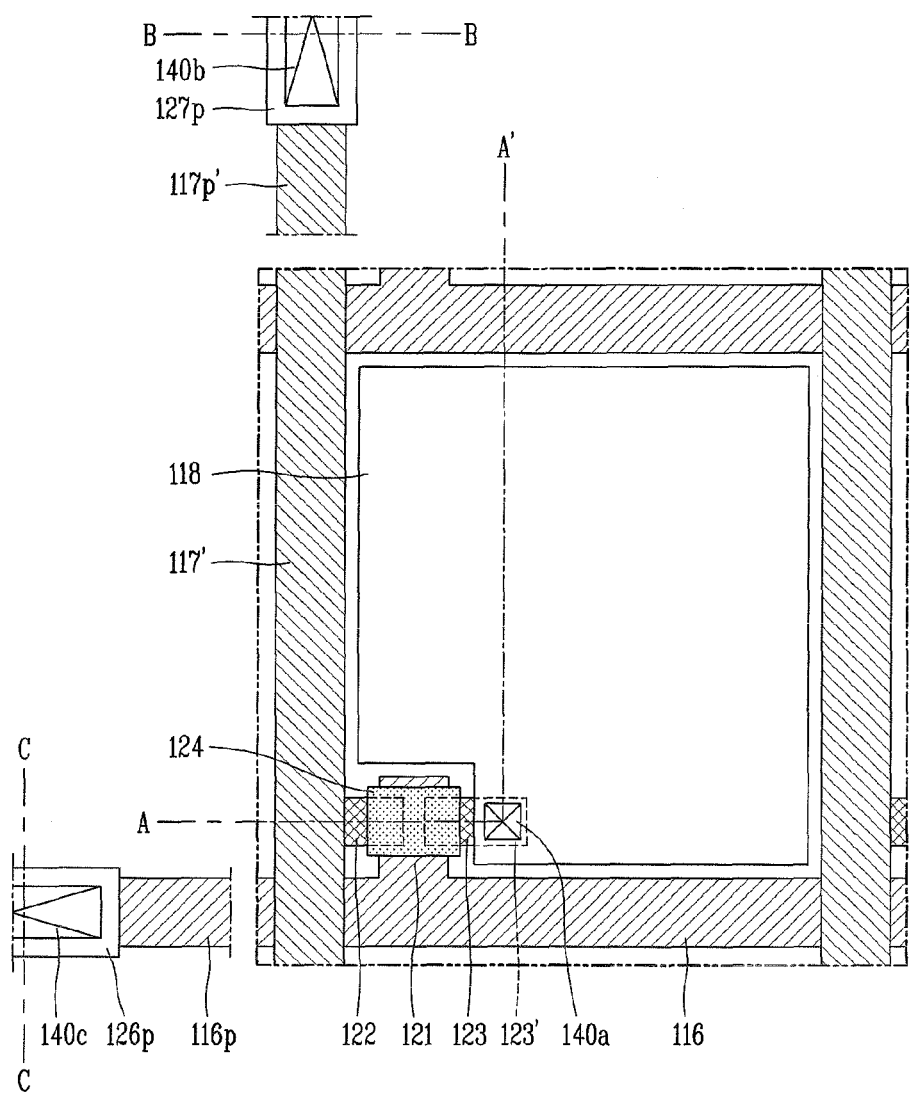
FIG. 5 is a plan view schematically showing a portion of an array substrate of an LCD according to a first embodiment of the present invention.

FIG. 5 is a plan view schematically showing a portion of an array substrate of an LCD according to a first embodiment of the present invention.

Here, N number of gate lines and M number of data lines cross so M×N number of pixels exist in an actual LCD device, but for the sake of explanation, a single pixel is illustrated in the drawings.

As illustrated, a gate line 116 and data lines 117 and 117' are formed to be arranged vertically and horizontally to define a pixel region on an array substrate 110. A thin film transistor (TFT), a switching element, is formed at a crossing of the gate line 116 and the data lines 117 and 117'. A pixel electrode 118 is formed within the pixel region and connected to the TFT to drive a liquid crystal layer (not shown) together with a common electrode of a color filter substrate (not shown).

Here, the oxide TFT according to a first embodiment of the present invention includes a gate electrode 121 formed on the array substrate 110, a gate insulating layer 115a formed on the gate electrode 121, first data wirings (i.e., a source electrode 122, a first drain electrode 123, and a first data line 117) and second data wirings (i.e., a second drain electrode 123' and a second data line 117') formed on the gate insulating layer 115a, and an active layer 124 formed of an oxide semiconductor on the source electrode 122 and the first drain electrode 123 and electrically connected to the source electrode 122 and the first drain electrode 123.

The oxide TFT according to the first embodiment of the present invention includes a protective film 115b formed on the array substrate 110 with the active layer 124 formed thereon and a pixel electrode 118 electrically connected to the second drain electrode 123' through a first contact hole 140a formed in the protective film 115b.

Here, the gate electrode 121 is connected to the gate line 116, and a portion of the source electrode 122 extends in one direction so as to be connected to the first data line 117, and the second data line 117' has a substantially same shape as that of the first data line 117 and formed on the first data line 117.

The second drain electrode 123' is formed on the first drain electrode 123 in which the first contact hole 140a is formed.

Here, the active layer 124 is formed by using an oxide semiconductor, the oxide TFT according to the present embodiment has high mobility, satisfies constant current test conditions, and secures uniform characteristics, so it can be advantageously applied to a large display including an LCD and an organic electroluminescent display.

Also, recently, strong interest and activities are concentrated on transparent electronic circuits, and the oxide TFT employing an oxide semiconductor as the active layer 124 has high mobility and can be fabricated at a low temperature, so it can be advantageously used in a transparent electronic circuit.

Also, the oxide semiconductor has a wide band gap, so it can be used for fabricating a UV LED, a white LED, and other components having high color purity, and also, since it is processed at a low temperature, a light, flexible product can be manufactured.

The oxide semiconductor includes an amorphous zinc oxide-based semiconductor such as a-IGZO. In the a-IGZO, zinc constitutes a main body, indium forms 5s-orbital to increase hole mobility through overlapping of a conduction band, and gallium restrains the generation of oxygen vacancy during a deposition of the metal oxide thin film to thereby serve to reduce an off-current and enhance device reliability when a TFT is implemented.

The oxide TFT according to the first embodiment of the present invention having the foregoing characteristics implements a short channel by forming the active layer 124 on the first data wirings, i.e., the source electrode 122 and the first drain electrode 123. Namely, since the active layer 124 is formed on the source electrode 122 and the first drain electrode 123, a channel length may be set to be a distance between the source electrode 122 and the first drain electrode 123, whereby the channel length can be designed to be shorter than that of an existing structure in which a channel length is determined by a line width of an etch stopper.

Also, in the oxide TFT according to the first embodiment of the present invention, since an etch stopper is omitted, a single photo process can be saved, and the first data wirings and the second data wirings may be formed together by using half-tone exposure, simplifying the process.

Namely, an existing oxide TFT has excellent performance in comparison to an existing amorphous silicon TFT, but is disadvantageous in that a photo process should be additionally performed due to the formation of an etch stopper. However, in the first embodiment of the present invention, after the gate electrode 121 and the gate insulating layer 115a are formed, the first and second data wirings are formed with heterogeneous metal materials, and here, the first and second data wirings are formed by using half-tone exposure, and then, the active layer 124 is patterned, whereby the protective film 115b may be immediately formed while an etch stopper is omitted. Here, among the first and second data wirings formed through half-tone exposure, the first data wiring in contact with the active layer 124 may be made of an metal material having excellent contact characteristics, and the other second data wiring may be made of a metal material having excellent conductivity, thereby utilizing in a large oxide TFT process.

On the edge region of the array substrate 110 according to the first embodiment of the present invention configured as described above, there are formed a gate pad electrode 126p and a data pad electrode 127p electrically connected to the gate line 116 and the data lines 117 and 117', respectively, and transmit a scan signal and a data signal received from an external driving circuit unit (not shown) to the gate line 116 and the data lines 117 and 117', respectively.

Namely, the gate line 116 and the data lines 117 and 117' extend toward the driving circuit unit and are connected to the gate pad line 116p and the data pad line 117p', respectively, and the gate pad line 116p and the data pad line 117p' receive a scan signal and a data signal from the driving circuit unit through the gate pad electrode 126p and the data pad electrode 127p electrically connected to the gate pad line 116p and the data pad line 117p', respectively.

Here, the data pad line 117p' is electrically connected to the data pad electrode 127p through a second contact hole 140b, and the gate pad line 116p is electrically connected to the gate pad electrode 126p through a third contact hole 140c.

FIGS. 6A to 6E are plan views sequentially showing a process of fabricating an array substrate illustrated in FIG. 5 according to the first embodiment of the present invention.

FIGS. 7A to 7E are sectional views sequentially showing a process of fabricating an array substrate illustrated in FIG. 5 according to the first embodiment of the present invention, in which the left side shows the process of fabricating the array substrate of the pixel part and the right side shows a process of sequentially fabricating the array substrate of the data pad part and the gate pad part.

Figure 6A:
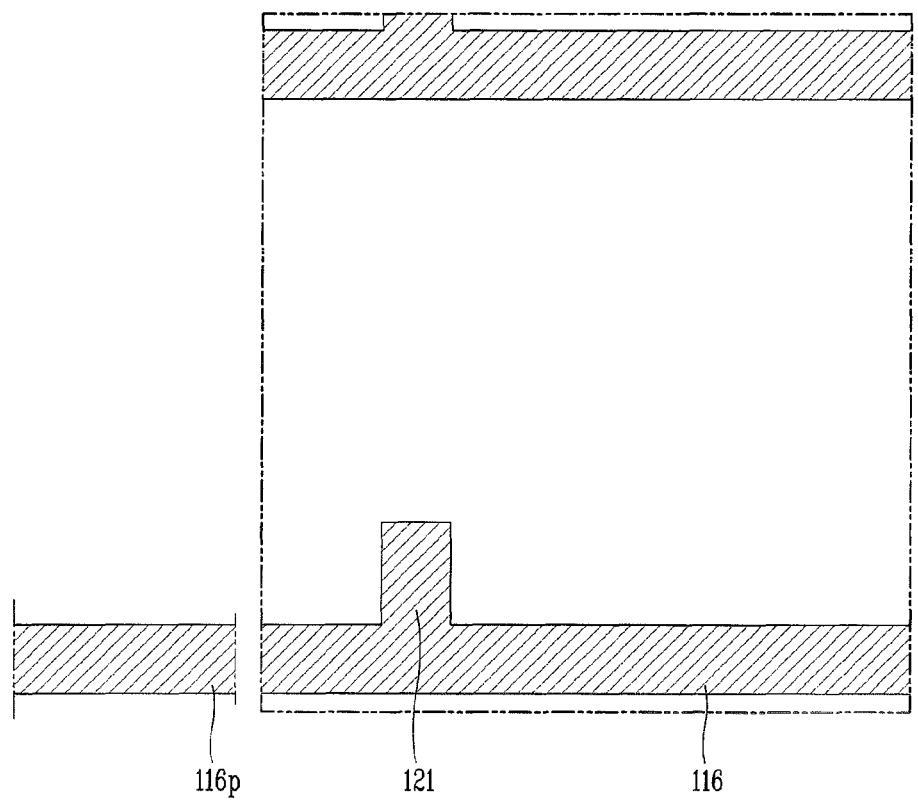
FIGS. 6A to 6E are plan views sequentially showing a process of fabricating an array substrate illustrated in FIG. 5 according to the first embodiment of the present invention.
Figure 7A:
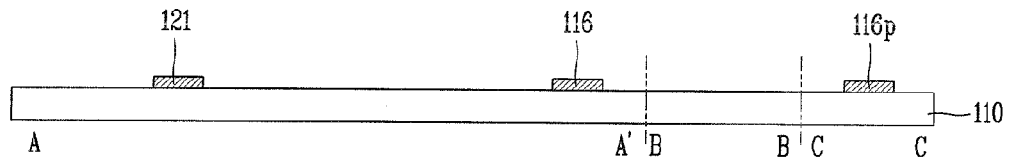
FIGS. 7A to 7E are sectional views sequentially showing a process of fabricating an array substrate illustrated in FIG. 5 according to the first embodiment of the present invention.

As illustrated in FIGS. 6A and 7A, the gate electrode 121 and the gate line 116 are formed at the pixel part of the array substrate 110 made of a transparent insulating material, and the gate pad line 116p is formed at the gate pad part of the array substrate 110.

Here, an oxide semiconductor applied to the oxide TFT according to an embodiment of the present invention is available for a low temperature deposition (or low temperature evaporation), so a substrate applicable to a low temperature process, such as a plastic substrate, soda lime glass, or the like, can be used. Also, since the oxide semiconductor exhibits amorphous characteristics, a substrate for a large display may be used.

Also, the gate electrode 121, the gate line 116 and the gate pad line 116p are formed by depositing a first conductive film on the entire surface of the array substrate 110 and then selectively patterning it through a photo process.

Here, the first conductive film may be made of a low-resistance opaque conductive material such as aluminum (Al), an aluminum alloy, tungsten (W), copper (Cu), nickel (Ni), chromium (Cr), molybdenum (Mo), a molybdenum alloy, titanium (Ti), platinum (Pt), tantalum (Ta), or the like. Also, the first conductive film may be made of a transparent conductive material such as indium tin oxide (ITO) or indium zinc oxide (IZO) and formed to have a multi-layered structure in which two or more conductive materials are stacked.

Figure 6B:
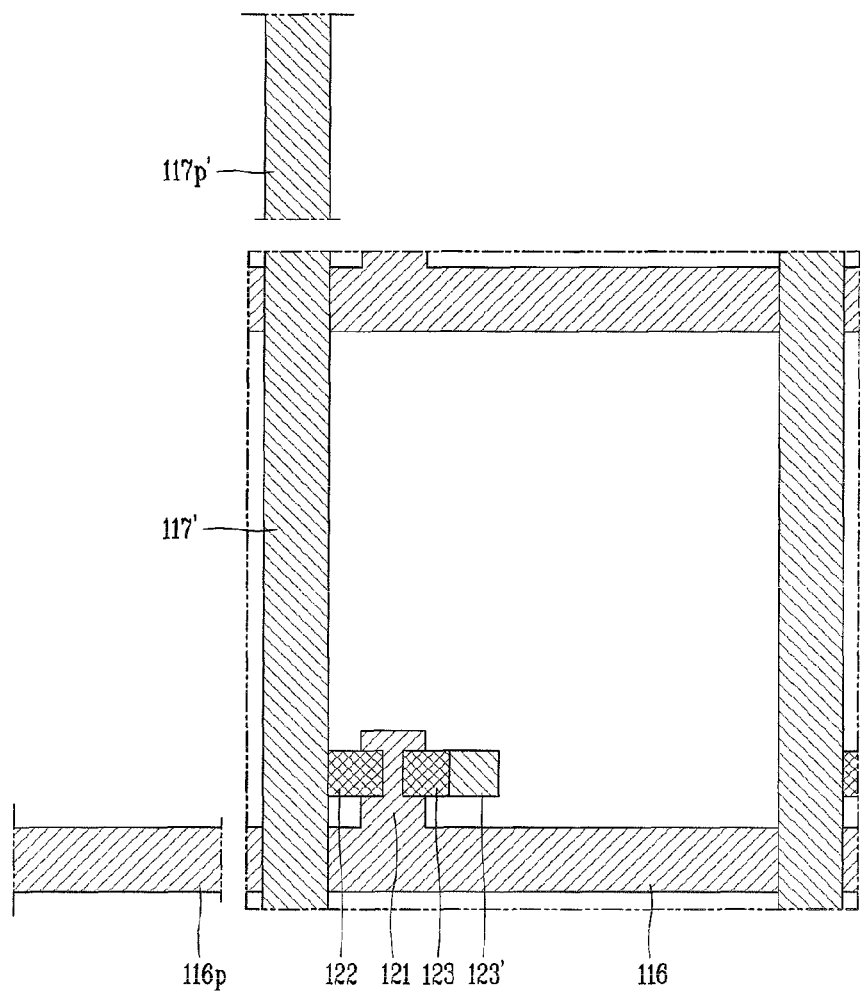
Figure 7B:
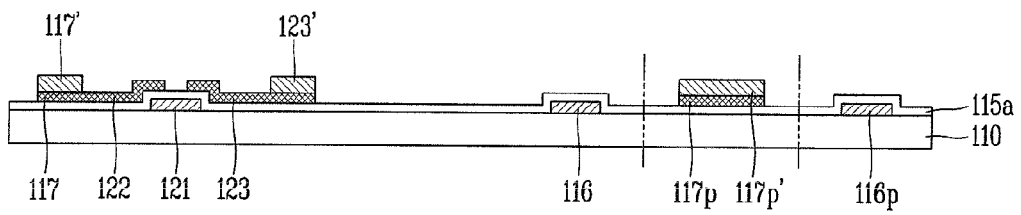

Next, as shown in FIGS. 6B and 7B, the gate insulating layer 115a, a second conductive film, and a third conductive film are sequentially formed on the entire surface of the array substrate 110 with the gate electrode 121, the gate line 116, and the gate pad line 116p formed thereon, and then, the second conductive film and the third conductive film are selectively patterned through a photo process to form a first data wiring and a second data wiring formed of the second conductive film and the third conductive film, respectively, on the array substrate 110.

Namely, the second conductive film is selectively patterned through a photo process to form the source electrode 122, the first drain electrode 123, and the first data line 117 formed of the second conductive film at the pixel part of the array substrate 110, and the first data pad line 117p formed of the second conductive film at the data pad part of the array substrate 110 (the formation of first data wirings).

Also, the second drain electrode 123', the second data line 117', and the second data pad line 117p' formed of the third conductive film are formed on the first drain electrode 123, the first data line 117, and the first data pad line 117p by selectively patterning the third conductive film through the photo process (the formation of second data wirings).

Here, a portion of the source electrode 122 extends in one direction so as to be connected to the first data line 117, and the second data line 117' has a substantially same shape as the first data line 117 and is formed on the first data line 117. The second drain electrode 123' is formed on an extended portion of the first drain electrode 123 extending to the pixel region.

Here, the first data wiring and the second data wiring may be formed a single photo process by using half-tone exposure, and this will be described in detail with reference to the accompanying drawings.

FIGS. 8A to 8F are sectional views specifically showing a second photo process illustrated in FIGS. 6B and 7B.

Figure 8A:
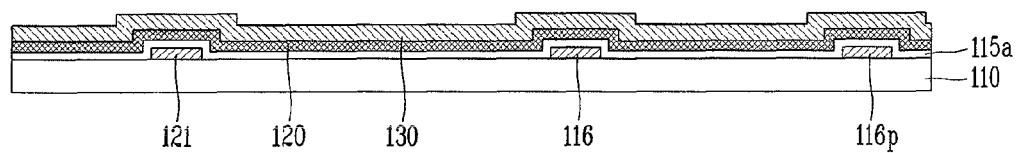
FIGS. 8A to 8F are sectional views specifically showing a second photo process illustrated in FIGS. 6B and 7B.

As shown in FIG. 8A, the gate insulating layer 115a, a second conductive film 120, and a third conductive film 130 are sequentially formed on the entire surface of the array substrate 110 with the gate electrode 121, the gate line 116, and the gate pad line 116p formed thereon.

Here, the gate insulating layer 115a may be formed as an inorganic insulating layer such as a silicon nitride film SiNx or a silicon oxide film $SiO_2$, or a high dielectric oxide film such as hafnium (Hf) oxide or aluminum oxide.

The second conductive film 120 may be made of a metal material such as molybdenum titanium (MoTi), ITO, titanium, molybdenum, or the like, having excellent contact characteristics with the active layer and the gate insulating layer 115a and excellent ohmic-contact with the active layer in order to form the first data wirings. The third conductive film 130 may be made of a metal material, which is different from that of the second conductive film 120, such as aluminum, copper, silver (Ag), gold (Au), or the like, having excellent conductivity in order to form the second data wirings.

Figure 8B:
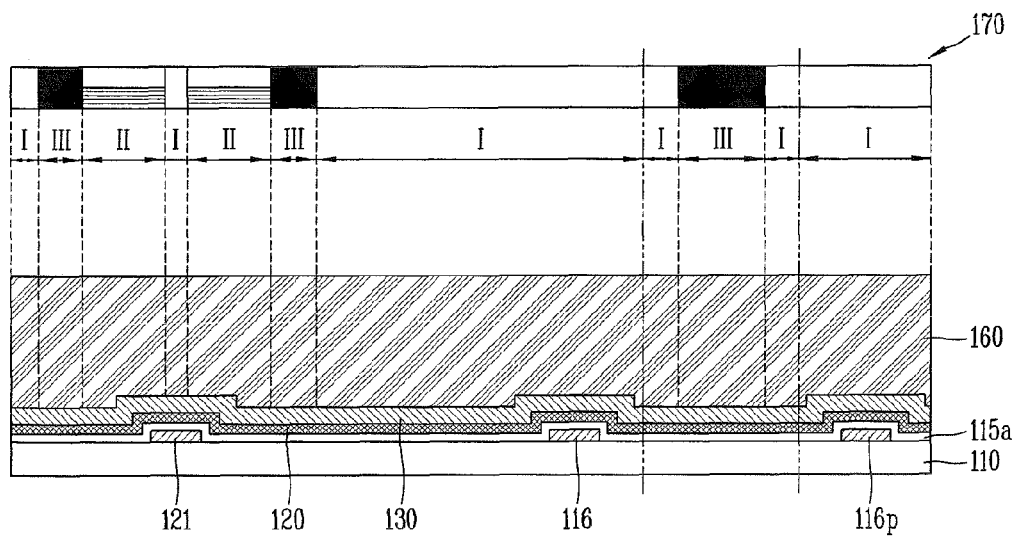

Next, as shown in FIG. 8B, a photosensitive film 160 made of a photosensitive material such as photoresist is formed on the array substrate 110 with the third conductive film 130 formed thereon, and then, light is selectively irradiated to the photosensitive film 160 through a half-tone mask 170 according to an embodiment of the present invention.

Here, the half-tone mask 170 includes a first transmission region I allowing irradiated light to be entirely transmitted therethrough, a second transmission region II allowing only a portion of light to be transmitted therethrough and blocking a portion thereof, and a blocking region III blocking entire irradiated light, and here, only light which has transmitted through the half-tone mask 170 may be irradiated to the photosensitive film 160.

Figure 8C:
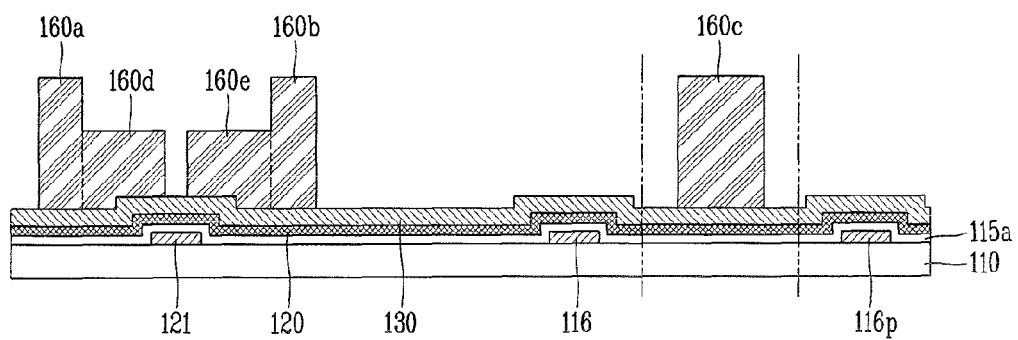

Subsequently, when the photosensitive film 160 which has been exposed through the half-tone mask 180 is developed, as shown in FIG. 8C, first to fifth photosensitive film patterns 160a to 160e having a certain thickness remain at regions where light was entirely blocked or partially blocked through the blocking region (III) and the second transmission region (II), and the photosensitive film at the transmission region (I) through which light was entirely transmitted has been completely removed to expose the surface of the third conductive film 130.

At this time, the first to third photosensitive film patterns 160a to 160c formed at the blocking region III is thicker than the fourth and fifth photosensitive film patterns 160d and 160e formed through the second transmission region II. In addition, the photosensitive film at the region in which the light had entirely transmitted through the first transmission region I was completely removed. This is because positive photoresist was used, but without being limited thereto, negative photoresist may also be used in an embodiment of the present invention.

Figure 8D:
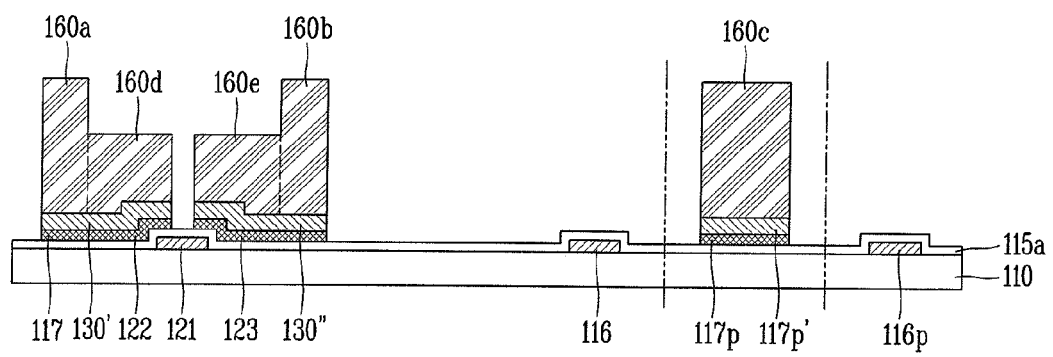

Subsequently, as shown in FIG. 8D, portions of the underlying second conductive film and third conductive film are selectively removed by using the first to fifth photosensitive film patterns 160a to 160e as masks to form the source electrode 122, the first drain electrode 123, and the first data line 117 formed of the second conductive film at the pixel part of the array substrate 110.

Also, the first data pad line 117p formed of the second conductive film is formed at the data pad part of the array substrate 110.

Here, conductive film patterns 130' and 130" formed of the third conductive film are formed on the source electrode 122, the first data line 117, and the first drain electrode 123, and the second data pad line 117p' formed of the third conductive film is formed on the first data pad line 117p.

Figure 8E:
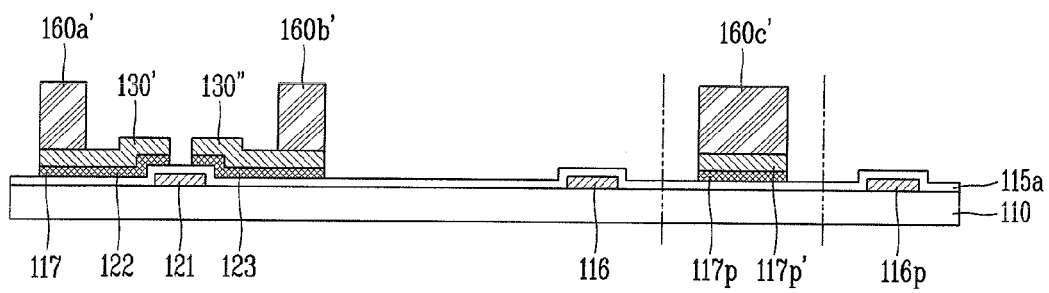

Thereafter, an ashing process is performed to remove portions of the first to fourth and fifth photosensitive film patterns 160a to 160d. Then, as shown in FIG. 8E, the fourth photosensitive film patterns at the second transmission region II are completely removed.

In this case, the first to third photosensitive film patterns remain as sixth photosensitive film pattern 160a' to eighth photosensitive film pattern 160c' with a thickness obtained by removing the thickness of the fourth and fifth photosensitive film patterns only on the region corresponding to the blocking region (III).

Figure 8F:
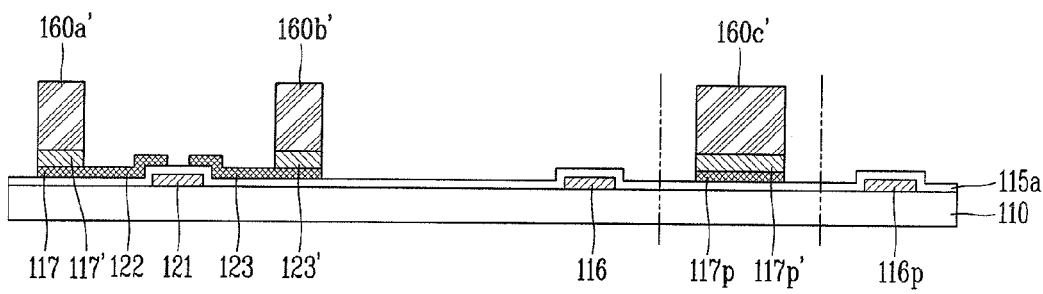

Thereafter as shown in FIG. 8F, portions of the underlying conductive film pattern is removed by using the sixth to eighth photosensitive film patterns 160a' to 160c' as masks to form the second drain electrode 123' and the second data line 117' formed of the third conductive film at the upper portions of the first drain electrode 123 and the first data line 117.

Here, as described above, the second data line 117' may be formed on the first data line 117 such that it has the substantially same shape as that of the first data line 117, and the second drain electrode 123' may be formed on the extended portion of the first drain electrode 123 extending to the pixel region.

Figure 6C:
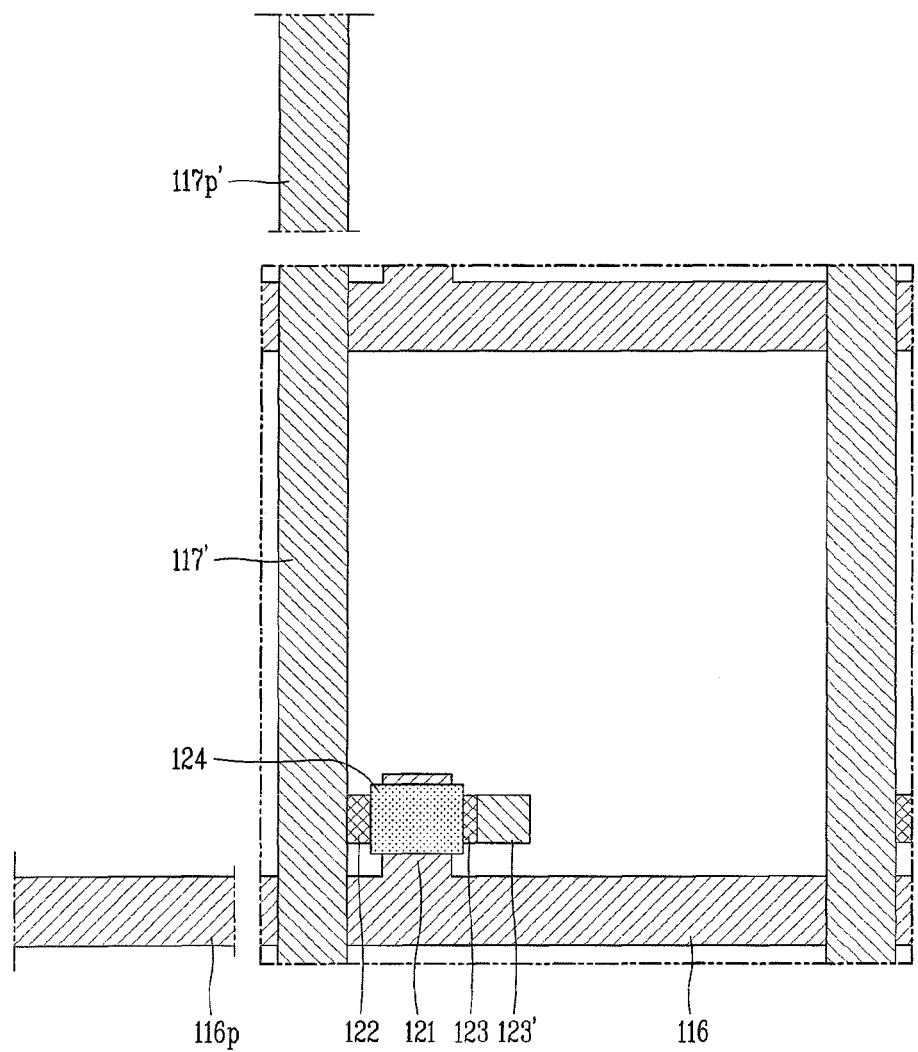
Figure 7C:
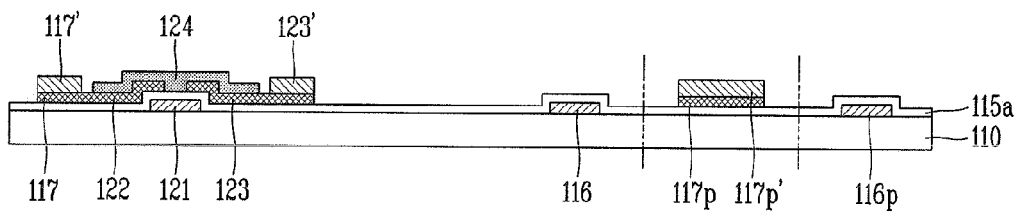

Thereafter, as shown in FIGS. 6C and 7C, an oxide semiconductor layer made of certain oxide semiconductor is formed on the entire surface of the array substrate 110 with the first and second data wirings formed thereon and selectively patterned through a photo process to form the active layer 124 formed of the oxide semiconductor at upper portions of the source electrode 122 and the first drain electrode 123 of the array substrate 110.

Here, the active layer 124 is formed in a form of an island positioned between the second data line 117' and the second drain electrode 123'.

In this manner, in the oxide TFT according to the first embodiment of the present invention eliminates the etch stopper, so a single photo process in comparison the existing etch stopper structure can be reduced, and the channel length can be determined by the first data wirings, namely, the source electrode 122 and the first drain electrodes 123, implementing a short channel having a length of about 4 μm~10 μm.

For example, when transmissivities of products of pixels per inch (ppi) class were compared, and it was noted that the transmissivity of oxide TFT was enhanced by 12.3% over the general amorphous silicon TFT. For reference, in case of an oxide semiconductor TFT employing such an existing etch stopper, since the size of the TFT is increased according to the application of the etch stopper, so transmissivity thereof is lowered in comparison to the amorphous silicon TFT implementing a short channel, but when the etch stopper is omitted, the transmissivity can be enhanced.

Figure 6D:
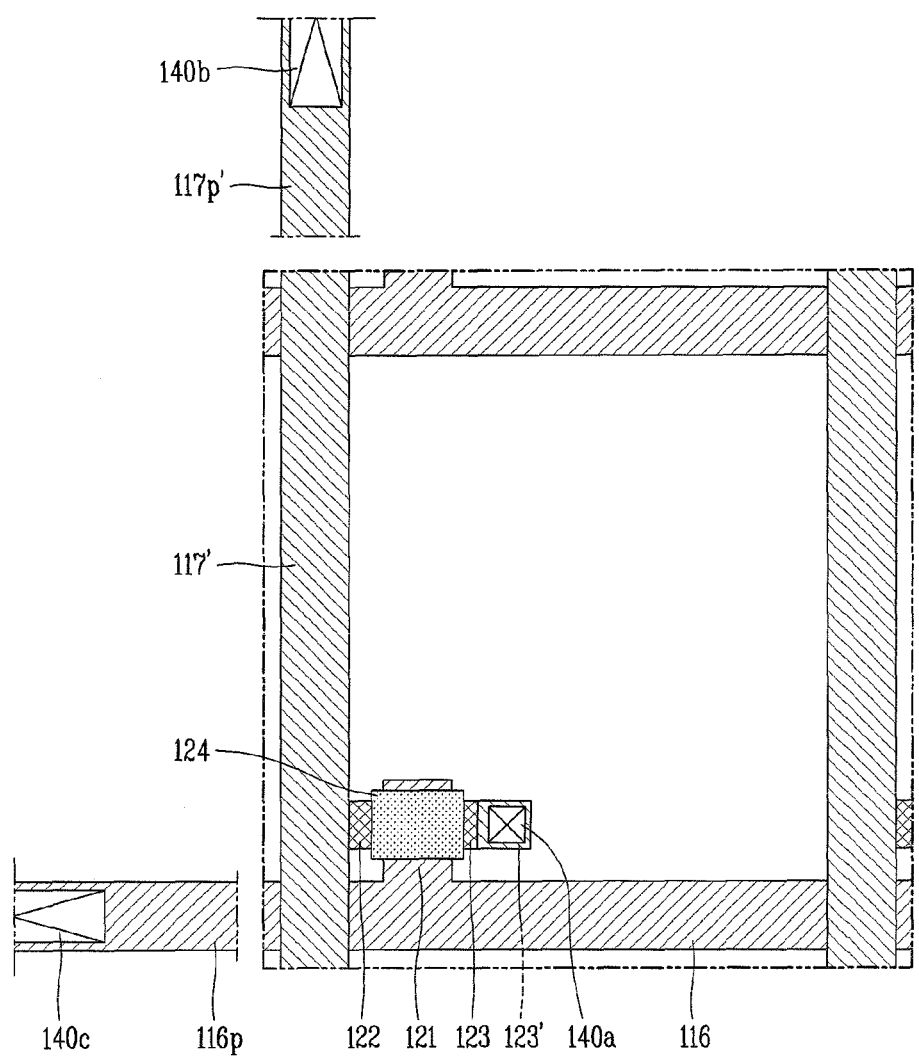
Figure 7D:
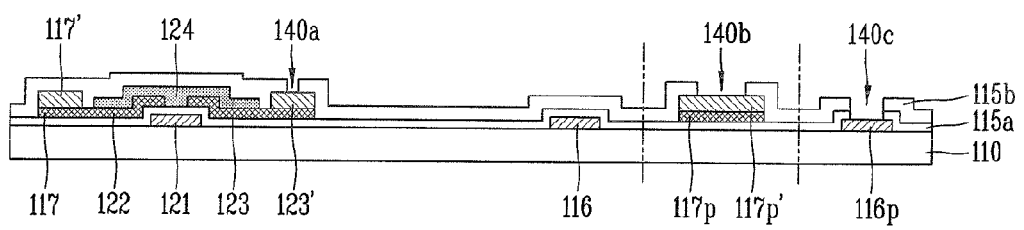

Thereafter, as shown in FIGS. 6D and 7D, the protective film 115b made of a certain insulating material is formed on the entire surface of the array substrate 110 with the active layer 124 formed thereon.

Thereafter, the gate insulating layer 115a and the protective film 115b are selectively removed through a photo process to form the first contact hole 140a exposing a portion of the second drain electrode 123' at the pixel part of the array substrate 110, and the second contact hole 140b and the third contact hole 140b, exposing portions of the second data pad line 117p' and the gate pad line 116p, respectively, on the data pad part and the gate pad part of the array substrate 110.

Here, the protective film 115b may be formed of an inorganic insulating film such as a silicon nitride film or a silicon oxide film, or a high dielectric oxide film such as hafnium oxide or aluminum oxide.

Meanwhile, in order to prevent a corrosion of the second data wiring, a certain thermal treatment may be performed while the active layer 124 is formed, namely, for example, after the oxide semiconductor layer is formed or after the protective film 115b is formed.

Figure 6E:
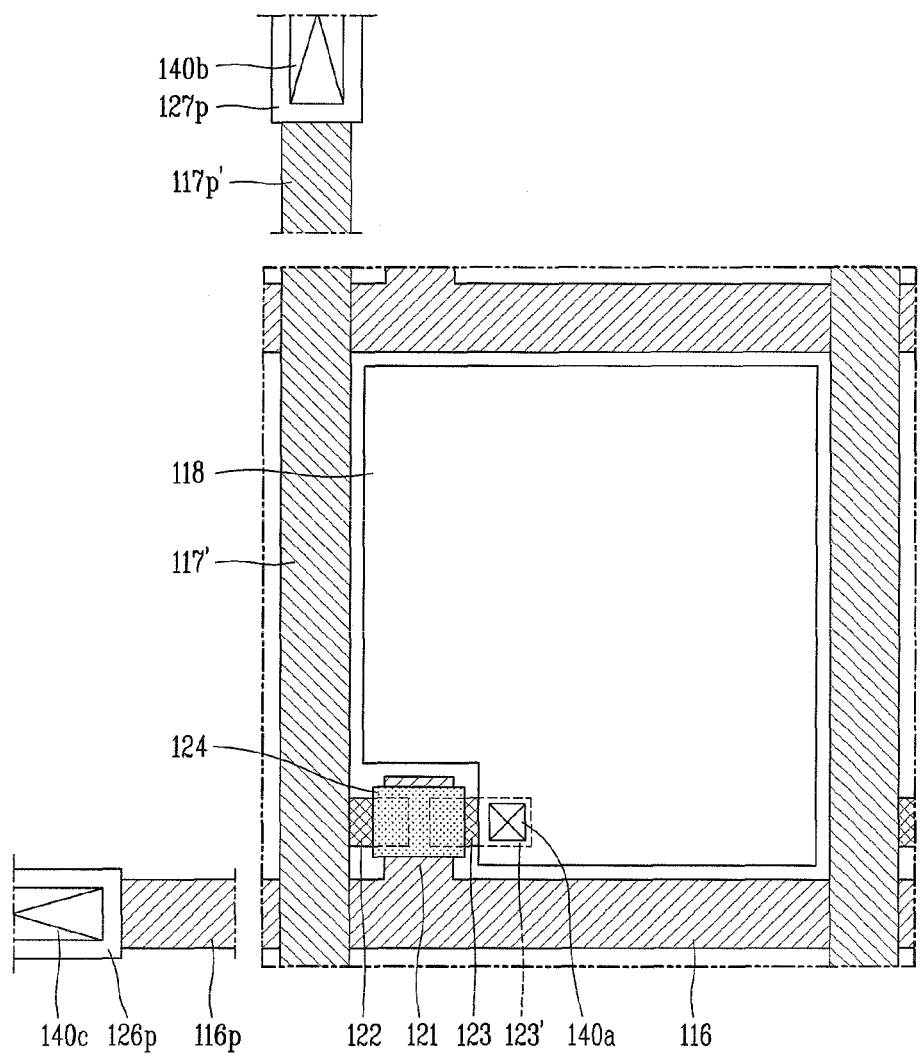
Figure 7E:
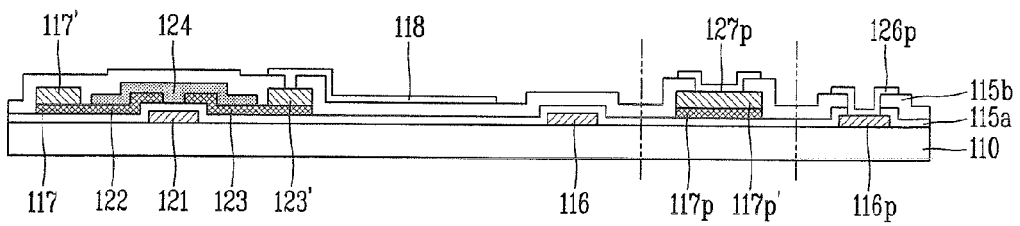

And then, as shown in FIGS. 6E and 7E, a fourth conductive film is formed on the entire surface of the array substrate 110 with the protective film 115b formed thereon and then selectively removed through a photo process to form the pixel electrode 118 formed of the fourth conductive film and electrically connected to the second drain electrode 123' through the first contact hole 140a at the pixel part.

Also, through the photo process, a data pad electrode 127p and a gate pad electrode 126p, which are formed of the fourth conductive film on the data pad part and the gate pad part of the array substrate 110 and electrically connected to the data pad line 117p' and the gate pad line 116p through the second contact hole 140b and the third contact hole 140b, are formed.

Here, the fourth conductive film may be made of a transparent conductive material having excellent transmissivity such as ITO or IZO in order to form the pixel electrode 118, the data pad electrode 127p, and the gate pad electrode 126p.

As described above, since the oxide TFT according to the first embodiment of the present invention implements the short channel having a length of 4 μm~10 μm, the performance of the oxide TFT, such as an enhancement of ON current, a reduction in parasitic capacitance, an enhancement of transmissivity, and the like, can be improved. Also, the oxide TFT according to the first embodiment of the present invention can omit the etch stopper, eliminating a photo process, and thus, process can be simplified.

Meanwhile, in the present embodiment, since the source and drain electrodes are formed on upper and lower portions of the active layer, a contact area with the active layer can be increased, an in this case, the device characteristics can be enhanced according to an improvement of ohmic-contact. This will be described in detail through the following second embodiment.

Figure 9:
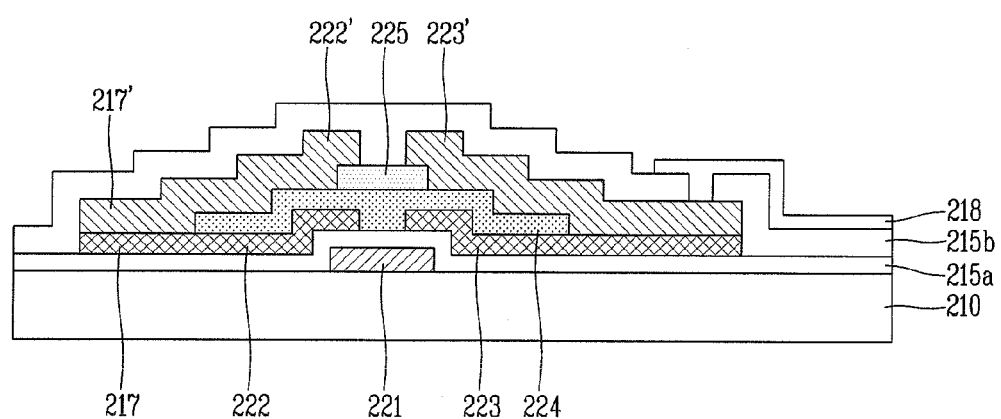
FIG. 9 is a sectional view schematically showing an oxide thin film transistor (TFT) according to a second embodiment of the present invention.

FIG. 9 is a sectional view schematically showing an oxide thin film transistor (TFT) according to a second embodiment of the present invention.

Figure 10:
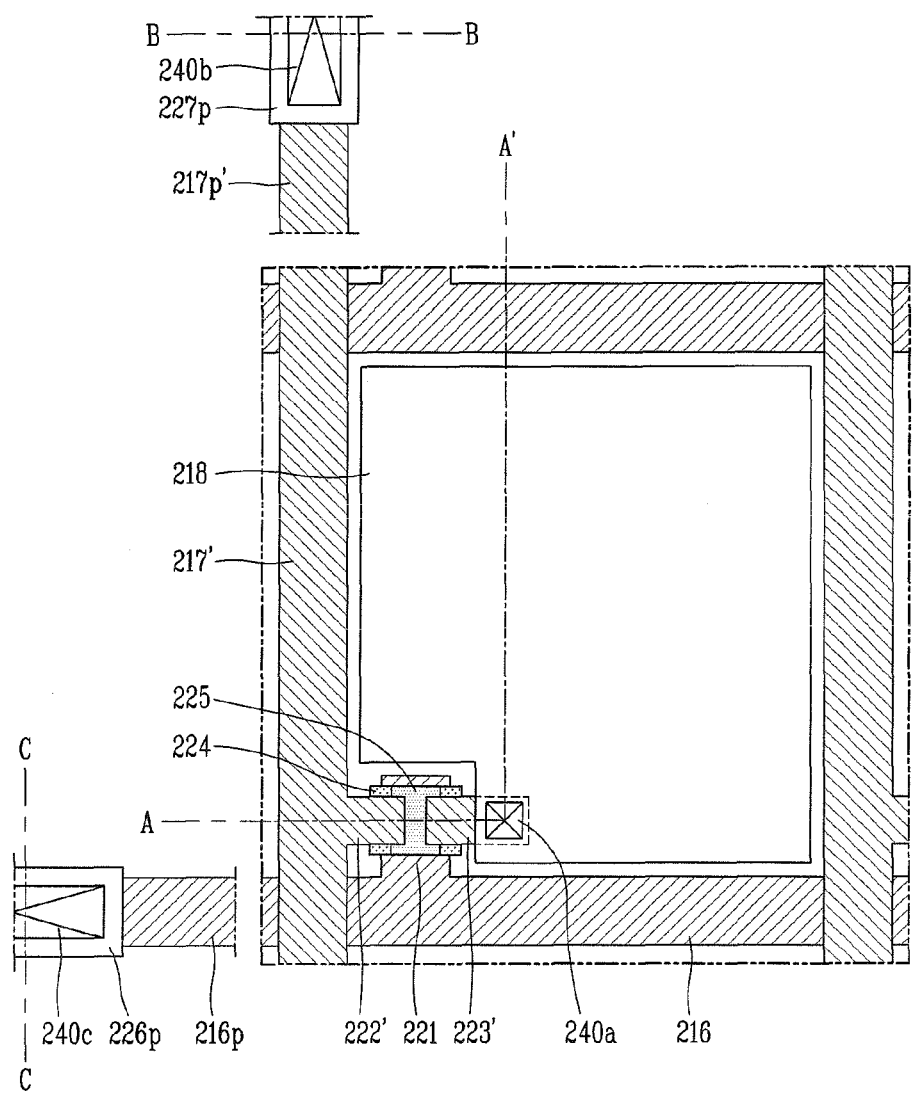
FIG. 10 is a plan view schematically showing a portion of an array substrate of an LCD according to the second embodiment of the present invention.

FIG. 10 is a plan view schematically showing a portion of an array substrate of an LCD according to the second embodiment of the present invention.

Here, N number of gate lines and M number of data lines cross so M×N numbers of pixels exist in an actual LCD device, but for the sake of explanation, a single pixel is illustrated in the drawings.

As illustrated, a gate line 216 and data lines 217 and 217' are formed to be arranged vertically and horizontally to define a pixel region on an array substrate 210. A thin film transistor (TFT), a switching element, is formed at a crossing of the gate line 216 and the data lines 217 and 217'. A pixel electrode 218 is formed within the pixel region and connected to the TFT to drive a liquid crystal layer (not shown) together with a common electrode of a color filter substrate (not shown).

Here, the oxide TFT according to a first embodiment of the present invention includes a gate electrode 221 formed on the array substrate 210, a gate insulating layer 215a formed on the gate electrode 221, first data wirings (i.e., a first source electrode 222, a first drain electrode 223, and a first data line 217) and second data wirings (i.e., a second source electrode 222', a second drain electrode 223', and a second data line 217') formed on the gate insulating layer 215a, an active layer 224 formed of an oxide semiconductor on the first source electrode 222 and the first drain electrode 223 and electrically connected to the first source electrode 222 and the first drain electrode 223, an etch stopper 225, second data wirings (i.e., a second source electrode 222' and a second drain electrode 223') and a second data line 217' formed on the active layer 224.

The oxide TFT according to the second embodiment of the present invention includes a protective film 215b formed on the array substrate 210 with the active layer 224 formed thereon and a pixel electrode 218 electrically connected to the second drain electrode 223' through a first contact hole 240a formed in the protective film 215b.

Here, the gate electrode 221 is connected to the gate line 216, and portions of the first source electrode 222 and the second source electrode 222' extend in one direction so as to be connected to the first data line 217 and the second data line 217', and the second data line 217' may have a substantially same shape as that of the first data line 217 and may be formed on the first data line 217.

Here, like the first embodiment of the present invention as described above, the active layer 224 is formed by using an oxide semiconductor, the oxide TFT according to the present embodiment has high mobility, satisfies constant current test conditions, and secures uniform characteristics, so it can be advantageously applied to a large display including an LCD and an organic electroluminescent display.

Also, recently, strong interest and activities are concentrated on transparent electronic circuits, and the oxide TFT employing an oxide semiconductor as the active layer 224 has high mobility and can be fabricated at a low temperature, so it can be advantageously used in a transparent electronic circuit.

Also, the oxide semiconductor has a wide band gap, so it can be used for fabricating a UV LED, a white LED, and other components having high color purity, and also, since it is processed at a low temperature, a light, flexible product can be manufactured.

The oxide semiconductor includes an amorphous zinc oxide-based semiconductor such as a-IGZO.

Also, the oxide TFT according to the second embodiment of the present invention having the foregoing characteristics implements a short channel by forming the active layer 224 on the first data wirings, i.e., the source electrode 222 and the first drain electrode 223. Namely, since the active layer 224 is formed on the first source electrode 222 and the first drain electrode 223, a channel length may be set to be a distance between the first source electrode 222 and the first drain electrode 223, whereby the channel length can be designed to be shorter than that of an existing structure in which a channel length is determined by a line width of an etch stopper.

Also, in the oxide TFT according to the second embodiment of the present invention, since the source and drain electrodes 222, 222', 223, and 223' are formed on upper and lower portions of the active layer 224, a contact area with the active layer 224 can be increased, and thus, the improvement of the ohmic-contact leads to an enhancement of the device characteristics.

On the edge region of the array substrate 210 according to the first embodiment of the present invention configured as described above, there are formed a gate pad electrode 226p and a data pad electrode 227p electrically connected to the gate line 216 and the data lines 217 and 217', respectively, and transmit a scan signal and a data signal received from an external driving circuit unit (not shown) to the gate line 216 and the data lines 217 and 217', respectively.

Namely, the gate line 216 and the data lines 217 and 217' extend toward the driving circuit unit and are connected to the gate pad line 216p and the data pad line 217p', respectively, and the gate pad line 216p and the data pad line 217p' receive a scan signal and a data signal from the driving circuit unit through the gate pad electrode 226p and the data pad electrode 227p electrically connected to the gate pad line 216p and the data pad line 217p', respectively.

Here, the data pad line 217p' is electrically connected to the data pad electrode 227p through a second contact hole 240b, and the gate pad line 216p is electrically connected to the gate pad electrode 226p through a third contact hole 240c.

FIGS. 11A to 11F are plan views sequentially showing a process of fabricating an array substrate illustrated in FIG. 10 according to the second embodiment of the present invention.

FIGS. 12A to 12F are sectional views sequentially showing a process of fabricating an array substrate illustrated in FIG. 10 according to the second embodiment of the present invention, in which the left side shows the process of fabricating the array substrate of the pixel part and the right side shows a process of sequentially fabricating the array substrate of the data pad part and the gate pad part.

Figure 11A:
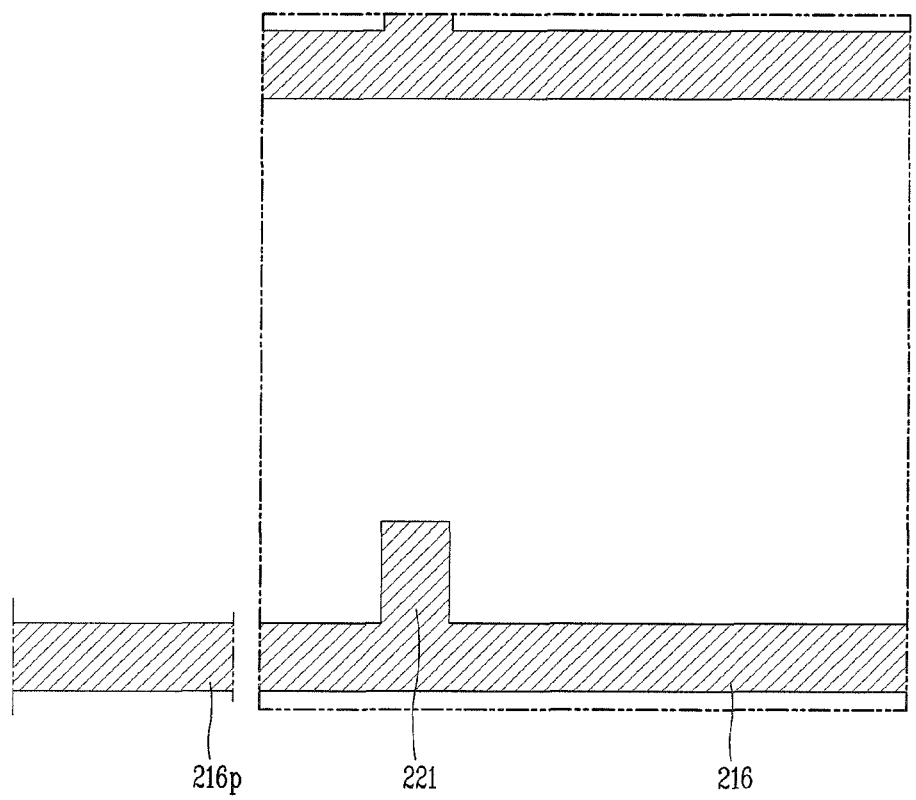
FIGS. 11A to 11F are plan views sequentially showing a process of fabricating an array substrate illustrated in FIG. 10 according to the second embodiment of the present invention.
Figure 12A:
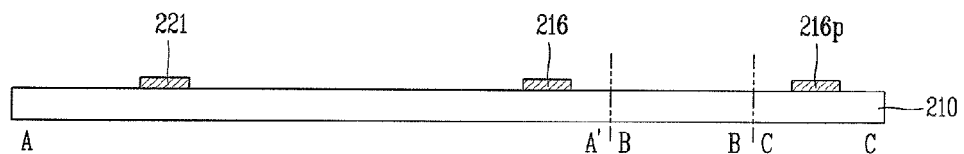
FIGS. 12A to 12F are sectional views sequentially showing a process of fabricating an array substrate illustrated in FIG. 10 according to the second embodiment of the present invention.

As illustrated in FIGS. 11A and 12A, the gate electrode 221 and the gate line 216 are formed at the pixel part of the array substrate 210 made of a transparent insulating material, and the gate pad line 216p is formed at the gate pad part of the array substrate 210.

Here, an oxide semiconductor applied to the oxide TFT according to an embodiment of the present invention is available for a low temperature deposition, so a substrate applicable to a low temperature process, such as a plastic substrate, soda lime glass, or the like. Also, since the oxide semiconductor exhibits amorphous characteristics, a substrate for a large display may be used.

Also, the gate electrode 221, the gate line 216 and the gate pad line 216p are formed by depositing a first conductive film on the entire surface of the array substrate 210 and then selectively patterning it through a photo process.

Here, the first conductive film may be made of a low-resistance opaque conductive material such as aluminum (Al), an aluminum alloy, tungsten (W), copper (Cu), nickel (Ni), chromium (Cr), molybdenum (Mo), a molybdenum alloy, titanium (Ti), platinum (Pt), tantalum (Ta), or the like. Also, the first conductive film may be made of a transparent conductive material such as indium tin oxide (ITO) or indium zinc oxide (IZO) and formed to have a multi-layered structure in which two or more conductive materials are stacked.

Figure 11B:
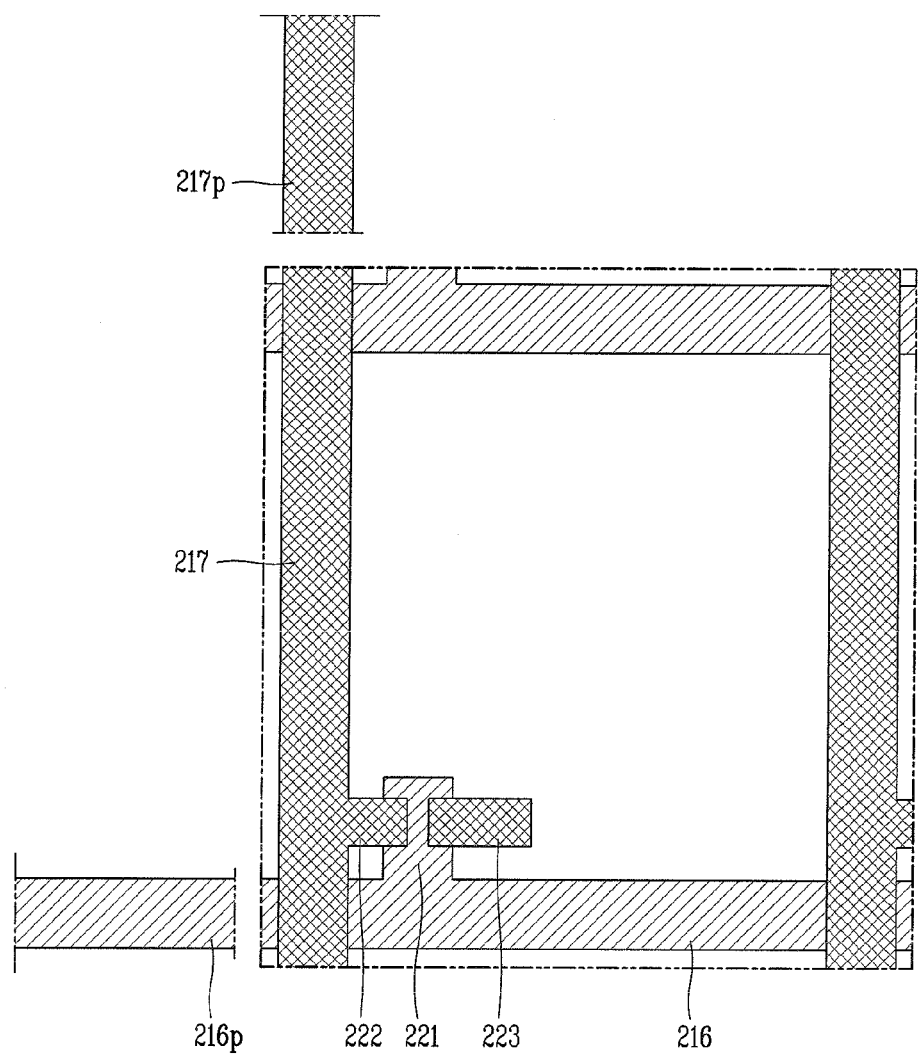
Figure 12B:
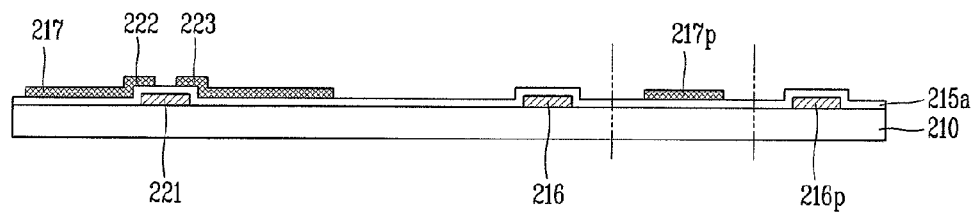

Next, as shown in FIGS. 11B and 12B, the gate insulating layer 215a and a second conductive film are sequentially formed on the entire surface of the array substrate 210 with the gate electrode 221, the gate line 216, and the gate pad line 216p formed thereon.

Thereafter, the second conductive film is selectively patterned through a photo process to form the first source electrode 222, the first drain electrode 223, and the first data line 217 formed of the second conductive film at the pixel part of the array substrate 210, and the first data pad line 217p formed of the second conductive film at the data pad part of the array substrate 210 (the formation of first data wirings).

Here, the gate insulating layer 215a may be formed as an inorganic insulating layer such as a silicon nitride film SiNx or a silicon oxide film $SiO_2$, or a high dielectric oxide film such as hafnium (Hf) oxide or aluminum oxide.

Also, the second conductive film 220 may be made of a metal material such as molybdenum titanium (MoTi), ITO, titanium, molybdenum, or the like, having excellent contact characteristics with the active layer and the gate insulating layer 215a and excellent ohmic-contact with the active layer in order to form the first data wirings.

Here, a portion of the first source electrode 222 extends in one direction so as to be connected to the first data line 217.

Figure 11C:
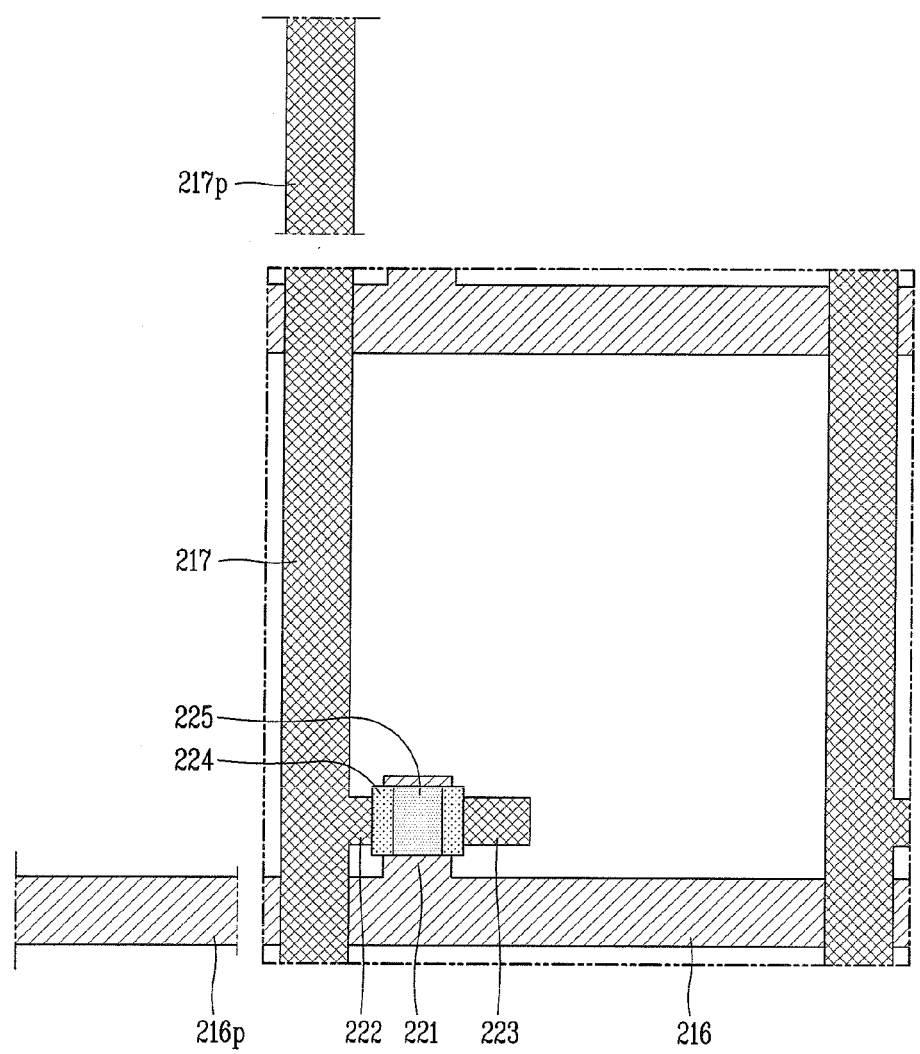
Figure 12C:
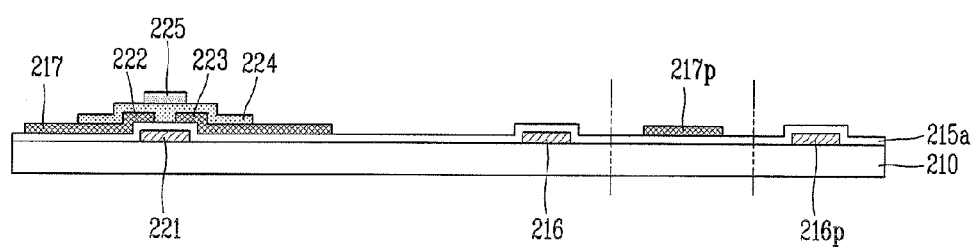

Thereafter, as shown in FIGS. 11C and 12C, an oxide semiconductor layer made of certain oxide semiconductor and an insulating layer are formed on the entire surface of the array substrate 210 with the first data wirings formed thereon and selectively patterned through a photo process to form the active layer 224 formed of the oxide semiconductor at upper portions of the first source electrode 222 and the first drain electrode 223 of the array substrate 210 and an etch stopper 225 formed of the insulating layer on the active layer 224.

Here, the active layer 224 is formed in a form of an island on the first source electrode 222 and the first drain electrode 223, and when half-tone exposure is used, the active layer 224 can be formed through the same photo process as that of the etch stopper 225.

Figure 11D:
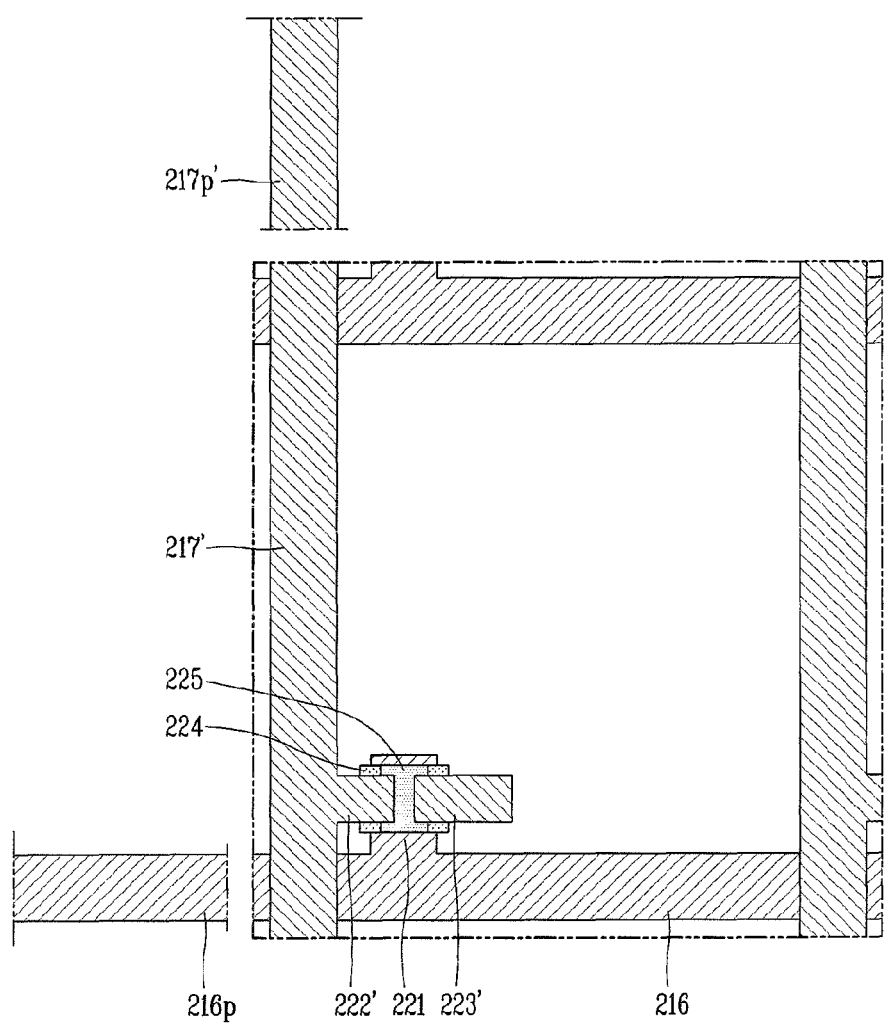
Figure 12D:
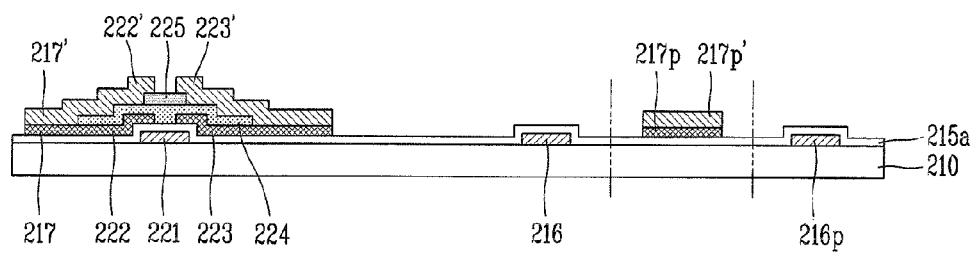

Next, as shown in FIGS. 11D and 12D, a third conductive film is formed on the entire surface of the array substrate 210 with the active layer 224 formed thereon.

Here, the third conductive film may be made of a metal material different from that of the second conductive film, and in this case, in order to form the second data wiring, the third conductive film may be made of a metal material such as aluminum, copper, silver, gold, or the like, having excellent conductivity. However, the present invention is not limited thereto.

Thereafter, the third conductive film is selectively removed through a photo process to form the second source electrode 222', the second drain electrode 223', and the second data line 217' formed of the third conductive film on the active layer 224 and the etch stopper 225, and the second data pad line 217p' formed of the third conductive film on the first data pad line 217p (the formation of second data wirings).

Here, a portion of the second source electrode 222' extends to be connected to the second data line 217', and the second data line 217' may have the substantially same shape as the first data line 217 and formed on the first data line 217.

Figure 11E:
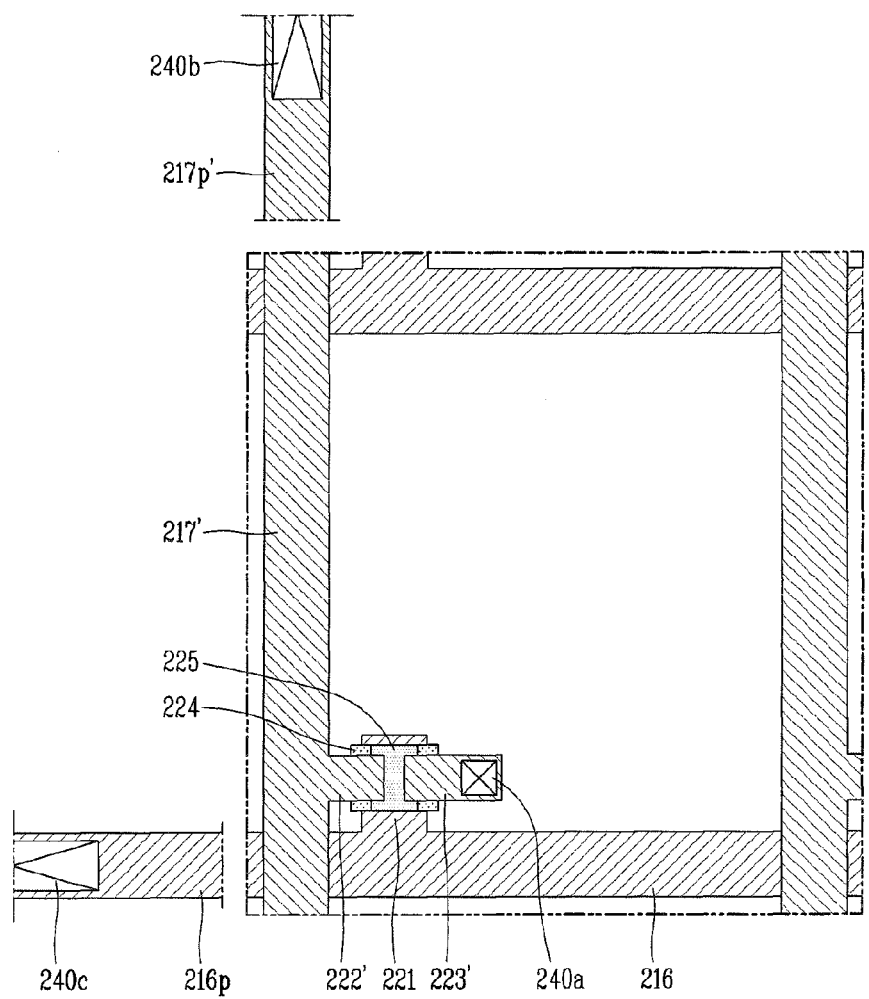
Figure 12E:
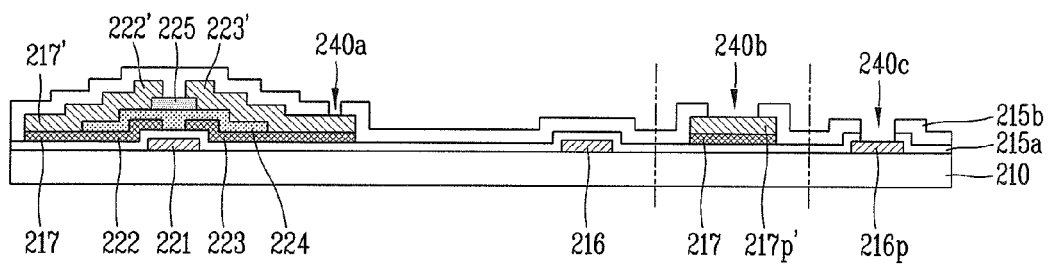

And then, as shown In FIGS. 11E and 12E, a protective film 215b made of a certain insulating material is formed on the entire surface of the array substrate 210 with the active layer 224 formed thereon.

Thereafter, the gate insulating layer 215a and the protective film 215b are selectively removed through a photo process to form the first contact hole 240a exposing a portion of the second drain electrode 223' at the pixel part of the array substrate 210, and the second contact hole 240b and the third contact hole 240b, exposing portions of the second data pad line 217p' and the gate pad line 216p, respectively, on the data pad part and the gate pad part of the array substrate 210.

Here, the protective film 215b may be formed of an inorganic insulating film such as a silicon nitride film or a silicon oxide film, or a high dielectric oxide film such as hafnium oxide or aluminum oxide.

Figure 11F:
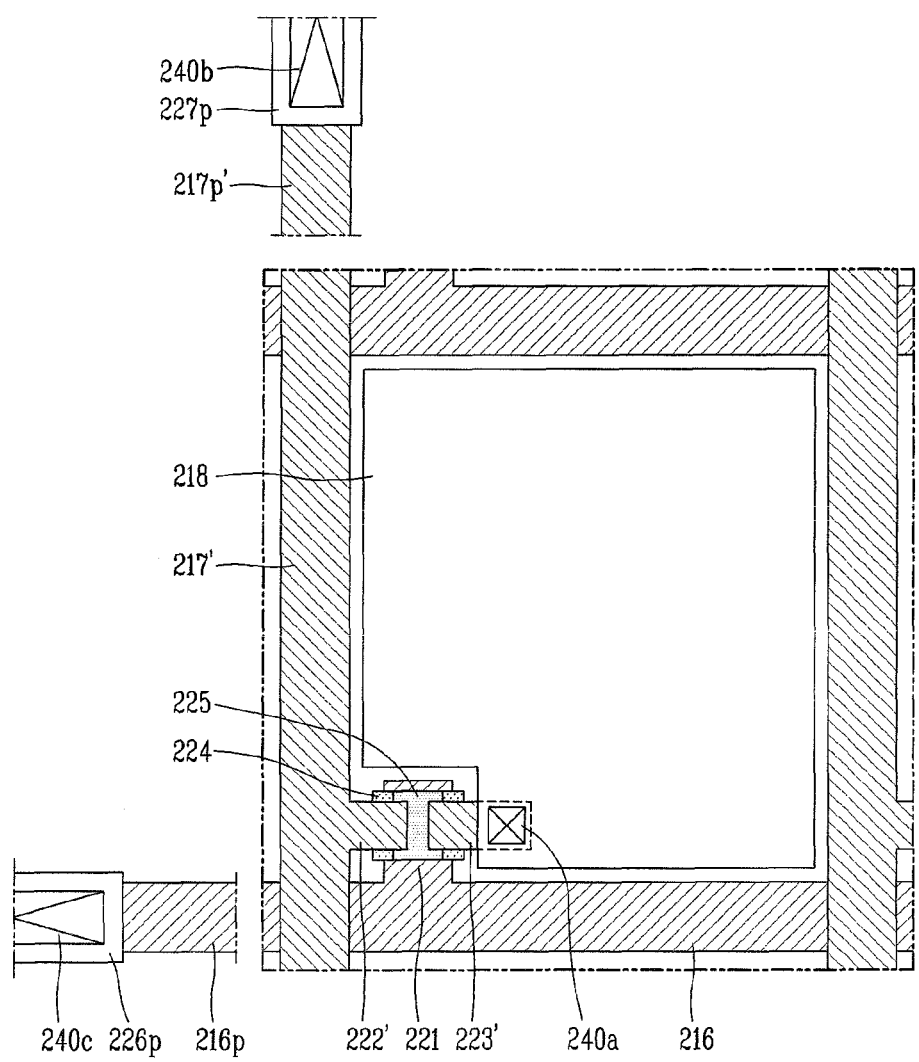
Figure 12F:
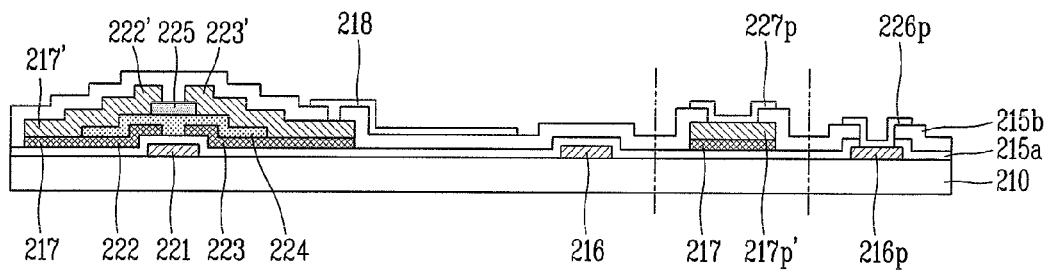

And then, as shown in FIGS. 11F and 12F, a fourth conductive film is formed on the entire surface of the array substrate 210 with the protective film 215b formed thereon and then selectively removed through a photo process to form the pixel electrode 218 formed of the fourth conductive film and electrically connected to the second drain electrode 223' through the first contact hole 240a at the pixel part.

Also, through the photo process, a data pad electrode 227p and a gate pad electrode 226p, which are formed of the fourth conductive film on the data pad part and the gate pad part of the array substrate 210 and electrically connected to the data pad line 217p' and the gate pad line 216p through the second contact hole 240b and the third contact hole 240b, are formed.

Here, the fourth conductive film may be made of a transparent conductive material having excellent transmissivity such as ITO or IZO in order to form the pixel electrode 218, the data pad electrode 227p, and the gate pad electrode 226p.

In the first and second embodiments, a twisted nematic (TN) type LCD device in which nematic phase liquid crystal molecules are driven in a vertical direction with respect to the substrate has been described, but the present invention is not limited thereto.

The present invention can be applicable to various modes of LCD devices such as an in-plane switching (IPS) mode LCD device in which liquid crystal molecules are driven in a direction horizontal to a substrate to enhance a viewing angle, a fringe field switching (FFS) LCD device in which a fringe field formed between a pixel electrode and a common electrode drives liquid crystal molecules positioned on the pixel region and the common electrode through a slit to thereby implement an image, and the like.

The present invention can be also applied to a different display device fabricated by using TFTs, for example, an OLED (Organic Light Emitting Diode) display device in which OLEDs are connected with driving transistors, as well as to the LCD device.

Also, in the present embodiment, since the amorphous oxide semiconductor material that which has high mobility and can be processed at a low temperature is applied as an active layer, it can be used in a transparent electronic circuit or a flexible display.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. An oxide thin film transistor (TFT) comprising:
    a gate electrode on a substrate;
    a gate insulating film on the gate electrode;
    a source electrode, a first drain electrode having an extended portion, and a first data line as an extended portion of the source electrode over the gate insulating film;
    a second drain electrode on the extended portion of the first drain electrode and a second data line on the first data line;
    an active layer made of an oxide semiconductor and on the source electrode and the first drain electrode, the active layer positioned between an opening of the source electrode and the first drain electrode and partially overlapping the source electrode and the first drain electrode, wherein a first part of the active layer and the second drain electrode are both directly on a same planar upper surface of the first drain electrode and the extended portion of the first drain electrode, and a second part of the active layer and the second data line are both directly on a same planar upper surface of the source electrode and the first data line;
    a protective film on the active layer; and
    a pixel electrode on the protective film and electrically connected to the second drain electrode, wherein:
    the second drain electrode is only on the extended portion of the first drain electrode; the second data line is only on the first data line; and
    the second drain electrode and the second data line are both spaced apart from the active layer with the protective film disposed therebetween.

2. The oxide thin film transistor of claim 1, wherein the active layer is made of an amorphous zinc oxide-based semiconductor.

3. The oxide thin film transistor of claim 1, wherein the source electrode, the first drain electrode and the first data line are made of a metal material selected from a group including molybdenum titanium (MoTi), indium-tin-oxide (ITO), titanium, and molybdenum (Mo).

4. The oxide thin film transistor of claim 3, wherein the second drain electrode and the second data line are made of a metal material selected from a group including aluminum, copper, silver, and gold, different from that of the source electrode, the first drain electrode and the first data line.

5. The oxide thin film transistor of claim 1, wherein the pixel electrode is electrically connected to an upper surface of the second drain electrode through a contact hole in the protective film.

6. The oxide thin film transistor of claim 1, wherein the second data line has a substantially same shape as that of the second drain electrode and is on the first data line.

* * * * *